(12) United States Patent
Masini et al.

(10) Patent No.: US 7,397,101 B1
(45) Date of Patent: Jul. 8, 2008

(54) GERMANIUM SILICON HETEROSTRUCTURE PHOTODETECTORS

(75) Inventors: Gianlorenzo Masini, Carlsbad, CA (US); Lawrence C. Gunn, III, Encinitas, CA (US); Giovanni Capellini, Rome (IT)

(73) Assignee: Luxtera, Inc., Carlsbad, CA (US)

( * ) Notice: Subject to any disclaimer, the term of this patent is extended or adjusted under 35 U.S.C. 154(b) by 312 days.

(21) Appl. No.: 11/177,132

(22) Filed: Jul. 7, 2005

Related U.S. Application Data

(60) Provisional application No. 60/589,298, filed on Jul. 20, 2004, provisional application No. 60/586,205, filed on Jul. 8, 2004, provisional application No. 60/586,161, filed on Jul. 8, 2004.

(51) Int. Cl.
*H01L 31/00* (2006.01)
(52) U.S. Cl. ............. 257/458; 257/E31.61; 257/656; 257/184; 257/616
(58) Field of Classification Search ............ 257/431, 257/656, E31.011, E31.06, E31.061, E31.063, 257/E31.068, E29.336, 12, 20, 190, 183, 257/184, 613, 616, 458
See application file for complete search history.

(56) References Cited

U.S. PATENT DOCUMENTS 6,897,498 B2 * 5/2005 Gothoskar et al. .......... 257/226

OTHER PUBLICATIONS

Gianlorenzo Masini, et al. "High-Performance p-i-n Ge on Si Photodetectors for the Near Infrared: From Model to Demonstration", Jun. 2001, 5 pages, vol. 48, No. 6.

* cited by examiner

*Primary Examiner*—Matthew C. Landau
*Assistant Examiner*—Jay Kim
(74) *Attorney, Agent, or Firm*—Fernandez & Associates, LLP

(57) ABSTRACT

A horizontal germanium silicon heterostructure photodetector comprising a horizontal germanium p-i-n diode disposed over a horizontal parasitic silicon p-i-n diode uses silicon contacts for electrically coupling to the germanium p-i-n through the p-type doped and n-type doped regions in the silicon p-i-n without requiring direct physical contact to germanium material. The current invention may be optically coupled to on-chip and/or off-chip optical waveguide through end-fire or evanescent coupling. In some cases, the doping of the germanium p-type doped and/or n-type doped region may be accomplished based on out-diffusion of dopants in the doped silicon material of the underlying parasitic silicon p-i-n during high temperature steps in the fabrication process such as, the germanium deposition step(s), cyclic annealing, contact annealing and/or dopant activation.

15 Claims, 22 Drawing Sheets

A silicon layer is established on a substrate with an electronically insulating top layer (Step 500).

A germanium region is established on top of the silicon p-i-n (Step 520).

The germanium region is converted into a germanium p-i-n aligned with the silicon p-i-n by outdiffusing the n-type and p-type dopants in the silicon p-i-n (Step 530).

At least one anode contact is established to the p-type doped region of the silicon p-i-n (Step 540).

At least one cathode contact is established to the n-type doped region of the silicon p-i-n, thereby establishing a germanium on silicon photodetector with silicon contacts (Step 550).

Figure 6

GERMANIUM SILICON HETEROSTRUCTURE PHOTODETECTORS

REFERENCE TO PRIOR APPLICATION

This application claims the benefit under 35 U.S.C. § 119 (e) of U.S. Provisional Patent Application No. 60/586,205 filed on Jul. 8, 2004, entitled "SAM-APD GeSi Waveguide Photodetector," which is incorporated by reference herein in its entirety. This application claims the benefit under 35 U.S.C. § 119(e) of U.S. Provisional Patent Application No. 60/586,161 filed on Jul. 8, 2004, entitled "Out-diffusion Contacted GeSi Waveguide Photodetector," which is incorporated by reference herein in its entirety. This application claims the benefit under 35 U.S.C. § 119(e) of U.S. Provisional Patent Application No. 60/589,298 filed on Jul. 20, 2004, entitled "Germanium Integration," which is incorporated by reference herein in its entirety.

FIELD OF INVENTION

Invention relates to semiconductor photodetectors, particularly to germanium silicon heterostructure photodetectors.

BACKGROUND OF INVENTION

Recent innovations in silicon optoelectronic materials have led to the development of silicon optoelectronic devices. Where possible, it would be useful to leverage the large scale investments made in standard silicon CMOS (Complementary Metal-Oxide Semiconductor) design and processing in the development, design and manufacture of silicon optoelectronic devices. In some cases, existing CMOS processes and tools may be leveraged to manufacture silicon optoelectronic devices. However, some challenges remain. For example, in some cases, the unique combination of Ge and Si can be exploited to improve the sensitivity of optical receivers operating in the near infra-red (NIR) regime due to the absorption properties of germanium in conjunction with the carrier multiplication properties of silicon; however, incorporating germanium into the standard silicon CMOS processes can be problematic. For example, the standard CMOS technology for establishing a contact to silicon material isn't as effective for reliably establishing a good quality contact to germanium. Furthermore, standard design platforms such as computer aided design (CAD) systems require a new set of design rules for integrating germanium into designs such as standard and/or custom CMOS designs. Technology gaps related to germanium integration into CMOS processes may hamper the design, development and manufacturability of a variety of new devices.

SUMMARY OF INVENTION

According to the current invention, a horizontal germanium silicon heterostructure photodetector comprising a horizontal germanium p-i-n diode disposed over a horizontal parasitic silicon p-i-n diode uses silicon contacts for electrically coupling to the germanium p-i-n through the p-doped and n-doped regions in the silicon p-i-n. The germanium p-i-n is aligned over the silicon p-i-n such that the p-doped region of the germanium p-i-n is in contact with the p-doped region of the silicon p-i-n; similarly, the n-doped region of the germanium p-i-n is in contact with the n-doped region of the silicon p-i-n. By establishing electrical contact to the p-doped and n-doped regions of the silicon p-i-n, the contacts may be electrically coupled to the germanium p-i-n without requiring direct physical contact to germanium material.

In some examples according to the current invention, the silicon p-i-n is substantially planar. However, in other examples according to the current invention, the silicon intrinsic region may be thicker than the silicon p-doped region and/or the silicon n-doped region. In some cases, a waveguide may be integrated with the horizontal germanium silicon heterostructure photodetector on the same substrate in a monolithic device. In one example according to the current invention, some of the silicon material in a silicon waveguide may be established on the same substrate simultaneously with the intrinsic silicon region of the parasitic silicon p-i-n diode.

In some examples according to the current invention, the current invention may be optically coupled to on-chip and/or off-chip optical waveguides. In some cases, optical waveguides may be optically coupled to the current invention using techniques such as, but not limited to, end-fire coupling and evanescent coupling.

According to one aspect of the current invention, the doping of the germanium p-type doped region may be accomplished based on out-diffusion of p-type dopants in the p-type doped silicon material of the underlying parasitic silicon p-i-n during high temperature steps in the fabrication process such as, but not limited to, the germanium deposition step(s), cyclic annealing, contact annealing and/or dopant activation. Similarly, the doping of the germanium n-type region may be accomplished based on out-diffusion of n-type dopants in the n-type silicon material of the underlying parasitic silicon p-i-n.

According to the current invention, an integrated avalanche photodetector may be formed from a germanium silicon heterostructure. A germanium absorption region for absorbing photons is in contact with a silicon avalanche region and cathode contacts and anode contacts enable the application of a bias voltage across the heterostructure. In some examples according to the current invention, the anode contacts may be established to the germanium material. However, in other examples according to the current invention, electrical contact for the anode may be established to the germanium region through physical contact to silicon material using standard technology for contacting silicon.

In some examples according to the current invention, the germanium collection region is established over a p-type doped silicon region and outdiffusion from the silicon region dopes a portion of the germanium, thereby establishing good electrical contact. Establishing a physical contact to the p-type doped silicon using standard CMOS technology enables the establishment of electrical contact to the germanium silicon avalanche detector without requiring the establishment of a physical contact to the germanium material.

According to the current invention, the integrated avalanche photodetector may be coupled to an on-chip and/or off-chip light source. In some examples according to the current invention, a separate absorption and multiplication avalanche photodetector (SAM-APD) device or a separate absorption and multiplication waveguide avalanche photodetector (SAM-WAPD) device may be established based on a germanium silicon heterostructure.

According to the current invention, design rules may be established for devices comprising germanium, thereby enabling and/or enhancing the manufacturability of photodetectors comprising germanium in integrated CMOS devices. For example photodetectors comprising germanium such as, but not limited to, photodetectors comprising silicon and germanium heterostructures as well as integrated avalanche photodetectors and horizontal germanium silicon heterostructure photodetectors, may be designed for manufacture according to standard and/or custom CMOS processes. In some cases, design rules may be established to define allowable ranges for geometrical parameters related to the shapes defined in one or more mask layers; in some cases, design rules may be established to define allowable ranges for geometrical parameters related to the dimensions of actually constructed devices. Typically, design rules may be used in conjunction with a computer-assisted product development system comprising a processor and storage. In some cases, design rules may be established based on processing constraints and/or device-oriented constraints. For example, design rules may be established based on processing constraints based on manufacturability and/or yield considerations; in some cases, design rules may be established based at least in part on avoiding physical configurations which may lead to inefficient or broken devices.

BRIEF DESCRIPTION OF DRAWINGS

FIG. 6 is a flowchart illustrating an example process for establishing a horizontal germanium silicon heterostructure photodetector according to the current invention.

DETAILED DESCRIPTION OF PREFERRED EMBODIMENTS

Figure 1:
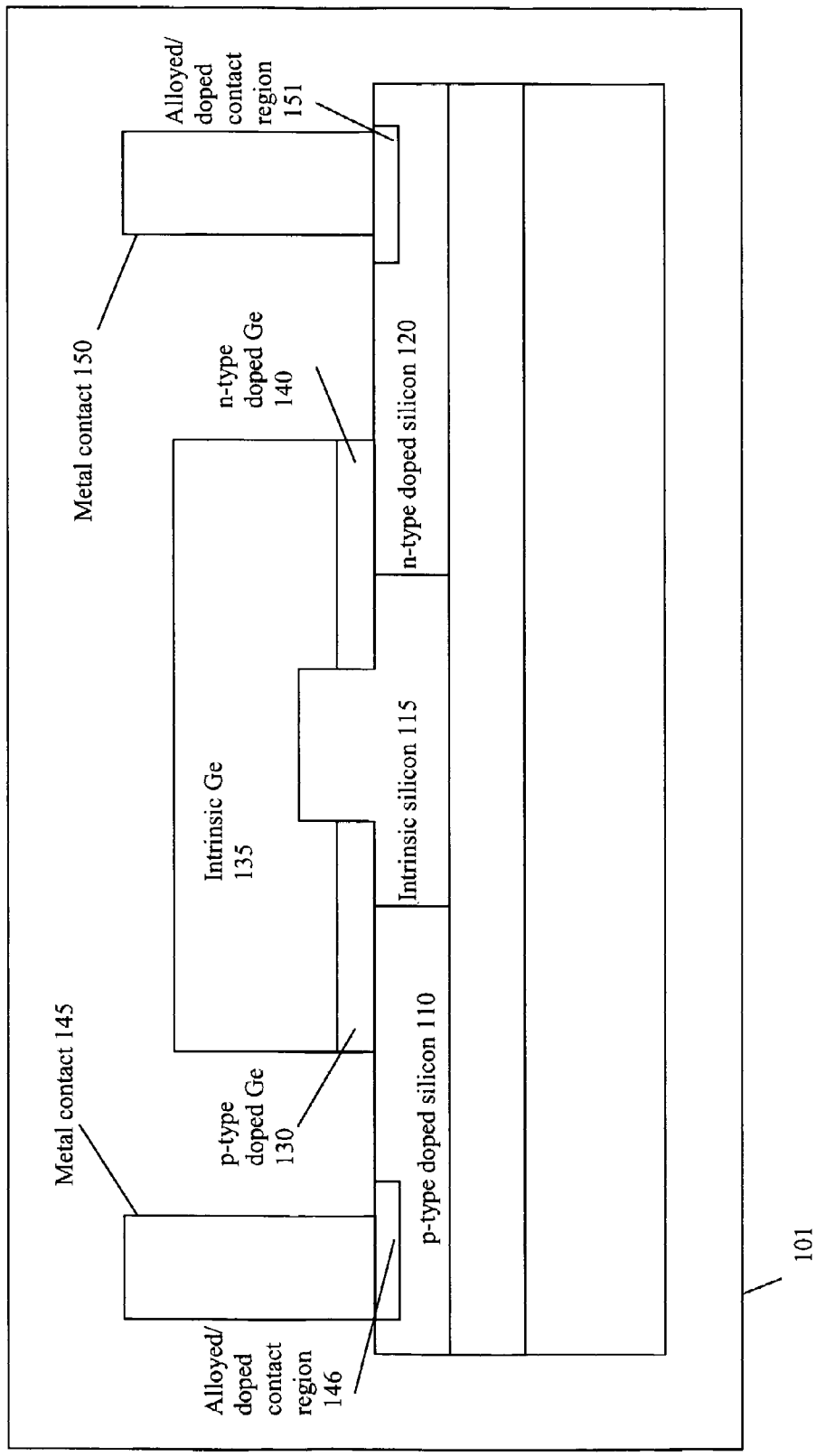
FIG. 1 illustrates an example of horizontal germanium silicon heterostructure photodetector according to the current invention.
Figure 2:
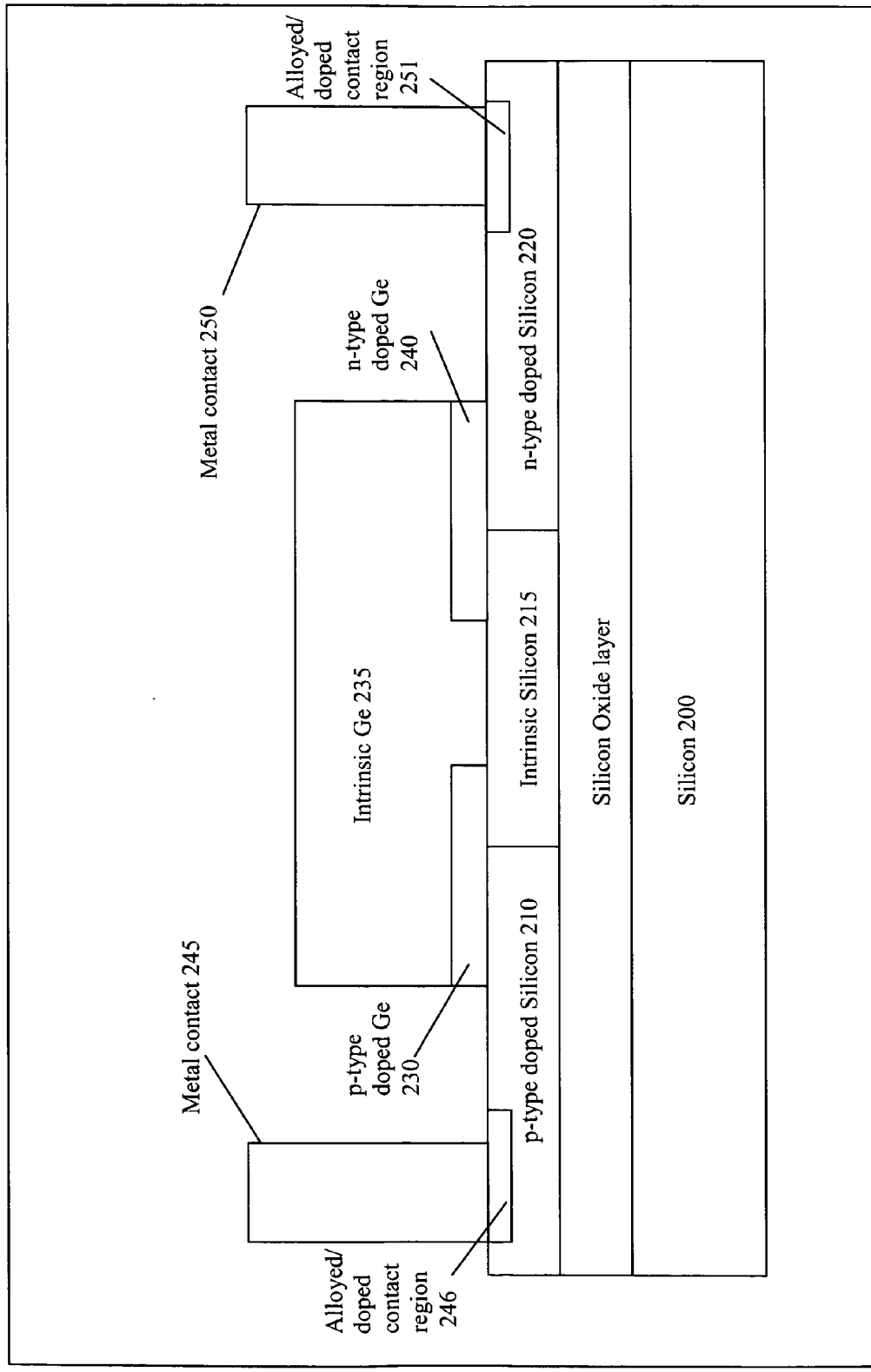
FIG. 2 illustrates an example of horizontal germanium silicon heterostructure photodetector according to the current invention.

FIGS. 1 and 2 illustrate examples of horizontal germanium silicon heterostructure photodetectors 101 and 201 according to the current invention. According to the current invention, a horizontal germanium silicon heterostructure photodetector comprises a horizontal germanium p-i-n diode disposed over a silicon p-i-n diode, integrated on a substrate. According to the current invention, an electrical contact is established to the p-type doped region of the silicon p-i-n and another electrical contact is established to the n-type doped region of the silicon p-i-n, thereby enabling electrical coupling to the germanium n-type doped and p-type doped regions without requiring the use of conventional metal contacts to a germanium layer.

In FIG. 1, the parasitic silicon p-i-n comprises p-type doped silicon 110, intrinsic silicon 115 and n-type doped silicon 120; the germanium p-i-n comprises p-type doped germanium 130, intrinsic germanium 135 and n-type doped germanium 140. Similarly, in FIG. 2, the parasitic silicon p-i-n comprises p-type doped silicon 210, intrinsic silicon 215 and n-type doped silicon 220; the germanium p-i-n comprises p-type doped germanium 230, intrinsic germanium 235 and n-type doped germanium 240. According to the current invention, the parasitic silicon p-i-n and the germanium p-i-n are substantially aligned such that they are electrically in parallel. In this configuration, the parasitic silicon p-i-n should not significantly degrade the detector performance of the germanium p-i-n. This may be due, in part, to the relatively low dark current density associated with the silicon p-i-n compared to the germanium p-i-n. Furthermore, the photodetector of the current invention may be used in light detection applications in the near infrared region (NIR) corresponding to wavelengths in the approximate range of 1.2 to 1.6 microns ($\mu$m); the silicon p-i-n should be substantially transparent to wavelengths in this range.

According to the current invention, the silicon intrinsic region may comprise unintentionally doped silicon, lightly doped silicon, intrinsic silicon and/or un-doped silicon. Similarly, the germanium intrinsic region may comprise unintentionally doped germanium, lightly doped germanium, intrinsic germanium and/or un-doped germanium.

Figure 3A:
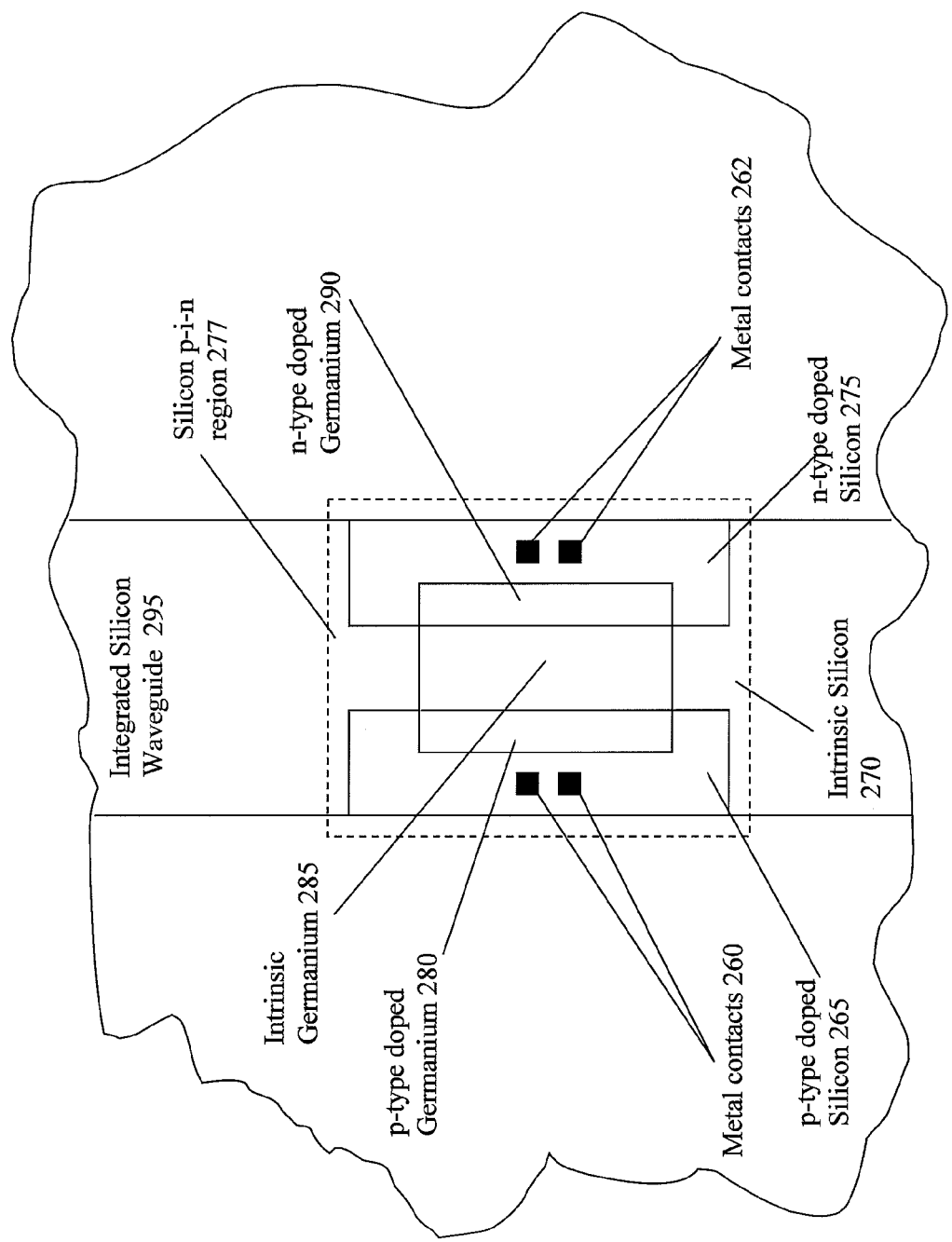
FIGS. 3a and b illustrate overhead views of examples of a detector according to the current invention.
Figure 3B:
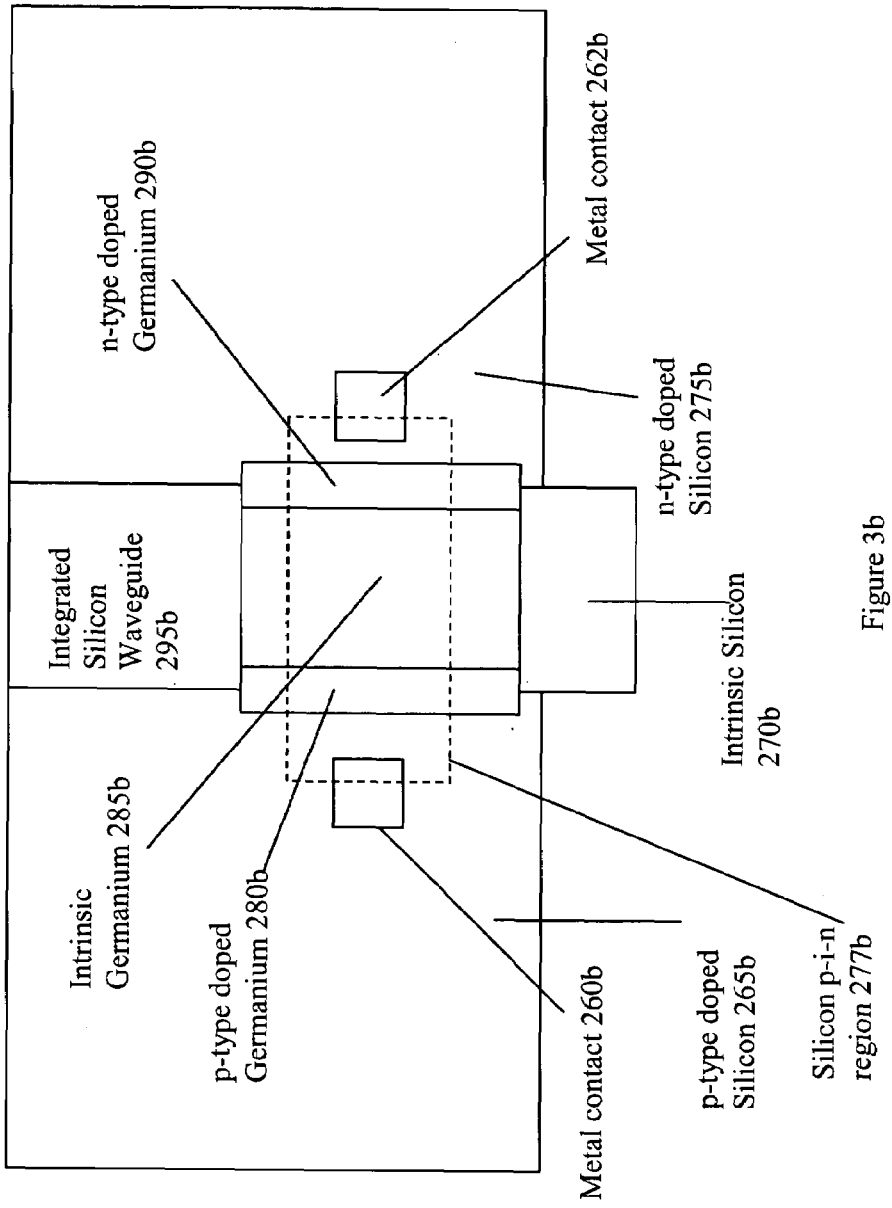

According to the current invention, in order to enable coupling to the germanium p-i-n through the silicon contacts, the p-type doped silicon region and the p-type doped germanium region must be in electrical contact; similarly, the n-type doped silicon region and the n-type doped germanium region must be in electrical contact. In some examples according to the current invention, the silicon p-i-n and the germanium p-i-n are of similar size and area and are substantially aligned. However, in other examples according to the current invention, the silicon p-i-n and the germanium p-i-n may be somewhat offset. Furthermore, in some cases, the silicon p-i-n and germanium p-i-n may have different shapes and/or dimensions. FIG. 3a illustrates an overhead view of an example of a detector according to the current invention. In this example, the silicon p-i-n is formed by silicon p-type doped region 265, silicon n-type doped region 275 and the portion of intrinsic silicon region 270 between regions 265 and 275; the smaller germanium p-i-n is formed by p-type doped germanium region 280, intrinsic germanium region 285 and n-type doped germanium region 290. In this example, the silicon p-i-n and the germanium p-i-n have different sizes but similar shapes. In other examples according to the current invention, the silicon p-i-n and the germanium p-i-n may or may not have the same basic shape. For example, FIG. 3b illustrates an overhead view of an example of a detector according to the current invention; in this example, the germanium p-i-n and the silicon p-i-n are not the same shape.

According to the current invention, at least one anode contact is established to the p-type doped silicon of the silicon p-i-n and at least one cathode contact is established to the n-type doped silicon of the silicon p-i-n. For example, anode metal contacts 145 and 245 illustrated in FIGS. 1 and 2 are established to p-type doped silicon regions 110 and 210, respectively; cathode metal contacts 150 and 250 are established to n-type doped silicon regions 120 and 220, respectively. However, in other examples according to the current invention, two or more contacts may be established. For example, in FIG. 3, there are two anode metal contacts 260 and two cathode metal contacts 262. In some cases, the use of multiple, small contacts may enable simple integration with standard CMOS processes.

According to the current invention, a horizontal germanium silicon heterostructure photodetector is integrated on a substrate. In FIGS. 1 and 2, substrates 100 and 200 are silicon substrates. However, according to the current invention, a variety of other substrates may be used. For example, the substrates may comprise a silicon-on-insulator (SOI) substrate, a silicon-on-sapphire (SOS) substrate or a silicon substrate.

According to the current invention, the horizontal germanium silicon heterostructure photodetector may be optically coupled to an on-chip or off-chip waveguide. According to the current invention, waveguides may be coupled the germanium layer of the photodetector using evanescent and/or endfire coupling. Depending on the configuration, external waveguides may be coupled through the top, edge and/or bottom surface of the substrate.

In some cases, the current invention may be integrated with an on-chip waveguide such as, but not limited to, an integrated silicon or silicon and germanium heterostructure optical waveguide. In some cases, some or all of the silicon and/or germanium associated with an integrated waveguide may be deposited, grown, patterned and/or doped concurrently in the same processing step(s) as some or all of the silicon and/or germanium which forms the detector's silicon p-i-n and/or the germanium p-i-n. For example, in FIG. 3, integrated silicon waveguide 295 is optically coupled to and monolithically integrated with a waveguide according to the current invention.

Figure 4:
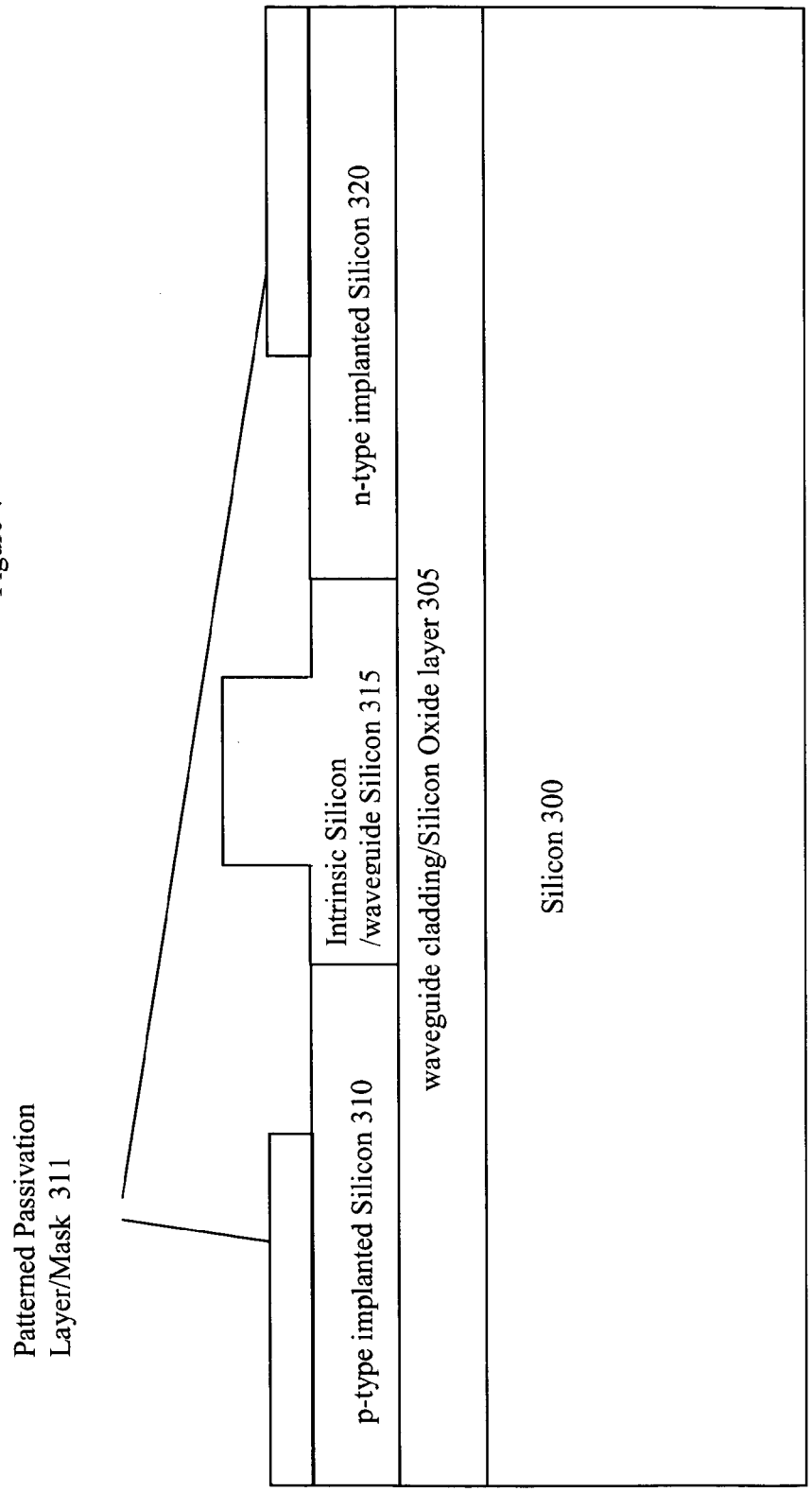
FIG. 4 illustrates an example of a partially processed wafer.

According to the current invention, an integrated horizontal germanium silicon heterostructure photodetector with an optionally integrated silicon waveguide may be established on substrate. In some cases, this may be compatible with standard CMOS processing. FIG. 4 illustrates an example of a partially processed wafer. A silicon layer suitable for creating a waveguide and a parasitic silicon p-i-n is established on an electronically insulating layer disposed on a substrate. In the region of the optionally integrated silicon waveguide, the electronically insulating layer may also serve as a cladding layer. For example, the insulating layer may comprise a silicon-oxide layer.

According to one example, an implantation and/or doping process may be used to introduce the p-type dopants into the silicon region 310 to form the p-type doped silicon region of the silicon p-i-n; similarly, an implantation and/or doping process may be used to introduce the n-type dopants into the silicon region 320 to form the n-type doped silicon region of the silicon p-i-n. In some cases, n-type dopants may be introduced along one side of the optionally integrated silicon waveguide and p-type dopants may be introduced along the other side of the optionally integrated silicon waveguide in the same implant/doping processing step(s) which are used to introduce n-type and p-type dopants into the silicon p-i-n structure. For example, in some cases, shallow, high dose implants may be used to introduce the n-type and/or p-type dopants. In some cases, the doped regions established along the sides of the waveguide may minimize or reduce free-carrier absorption losses in the waveguide and/or help preserve a low series resistance.

Figure 5:
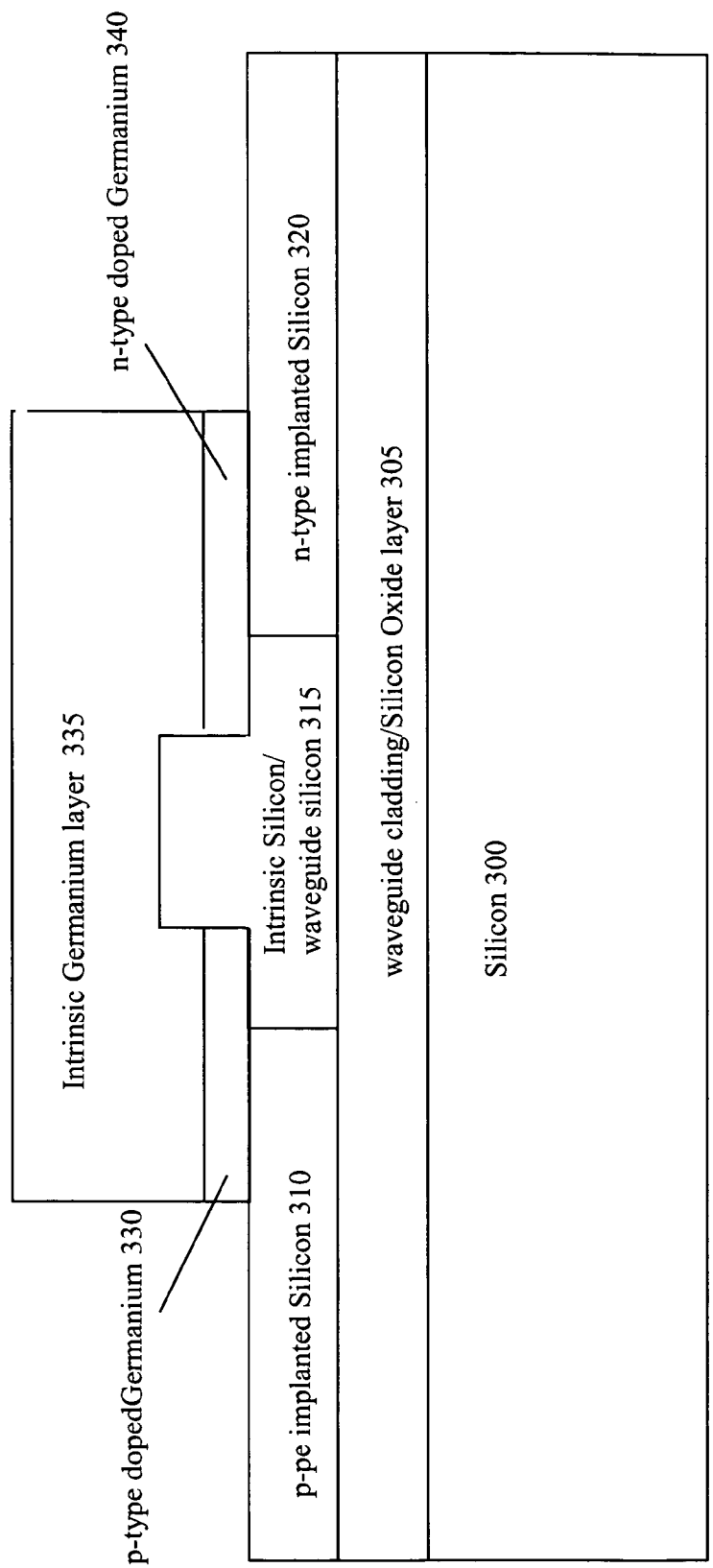
FIG. 5 illustrates an example intermediate structure which may result after the selective deposition of a germanium layer.

According to the current invention, a germanium layer is established over the silicon layer. In one example, a patterned passivation layer and/or mask such as layer 311 may establish a window on top of the silicon layer defining the region where the germanium for the germanium p-i-n may be grown. In some cases according to the current invention, the germanium layer forming the germanium p-i-n may comprise one or more layers of germanium and may comprise single crystal germanium, polycrystalline germanium and/or amorphous germanium. In some cases, a thin layer of germanium may be grown slowly at a low temperature followed by a thicker layer of germanium grown quickly at a higher temperature. In some cases, it may be advantageous to minimize defects and/or contamination at the silicon germanium interface in the interest of minimizing photocarrier loss and/or trapping in the photodetector; in some cases, slow, low temperature germanium growth may provide smoother and/or less defective interfaces than faster, high temperature germanium growth. Furthermore, a variety of germanium deposition and/or growth techniques may be used such as, but not limited to, the selective area deposition of germanium. Note that once the dopants have been introduced in the silicon layer, dopant diffusion into the silicon material and dopant outdiffusion into the adjacent germanium material occur during subsequent high temperature operations such as, but not limited to, germanium growth, cyclic annealing, contact annealing, and dopant activation. FIG. 5 illustrates an example intermediate structure which may result after the selective deposition of a germanium layer 355. The n-type and p-type dopants outdiffuse from the implanted regions 310 and 320 into the germanium material in regions 330 and 340, forming a germanium p-i-n from regions 330, 335 and 340. Anode and cathode contacts may be established to silicon regions 310 and 320 to form an example of an integrated horizontal germanium silicon heterostructure photodetector with an optionally integrated silicon waveguide according to the current invention. In this example, the silicon waveguide is contiguous with the intrinsic silicon region 315 of the silicon p-i-n; furthermore, in this example, some portion of the intrinsic silicon region is thicker than the p-type doped region 310 and the n-type doped region 320 of the silicon p-i-n. In some cases, this configuration enables effective optical coupling of the optional integrated optical waveguide with the germanium p-i-n formed by germanium regions 330, 335 and 340. In other examples according to the current invention, different germanium deposition and/or growth techniques may be used such as, but not limited to, selective area growth.

In some cases, a horizontal germanium silicon heterostructure photodetector may be coupled to light from an external optical waveguide. For example, in some cases, optical power may be coupled from an external waveguide through the bottom surface of the substrate into the germanium p-i-n; for bottom coupled configurations, the layers beneath the germanium p-i-n such as, but not limited to, the silicon p-i-n and at least some portion of the electronically insulating layer should be substantially transparent to the applicable wavelength of light to enable light to be coupled from the bottom surface through to the germanium p-i-n. For example, for the NIR, at least some portion of the electronically insulating layer should be substantially transparent in the range of wavelengths in the approximate range of 1.2 to 1.6 microns ($\mu m$).

Furthermore, in some cases, when a horizontal germanium silicon heterostructure photodetector is designed for coupling to light from an external optical waveguide, the silicon p-i-n may or may not be planar.

FIG. 6 is a flowchart illustrating an example process for establishing a horizontal germanium silicon heterostructure photodetector according to the current invention. According to the current invention, a method for establishing a horizontal germanium silicon heterostructure photodetector starts when a silicon layer is established on a substrate with an electronically insulating top layer (Step 500). A horizontal silicon p-i-n is defined in the silicon layer by introducing n-type and p-type dopants (Step 510). A germanium region is established on top of the silicon p-i-n (Step 520). The germanium region is converted into a germanium p-i-n aligned with the silicon p-i-n by outdiffusing the n-type and p-type dopants in the silicon p-i-n (Step 530). At least one anode contact is established to the p-type doped region of the silicon p-i-n (Step 540). At least one cathode contact is established to the n-type doped region of the silicon p-i-n, thereby establishing a germanium on silicon photodetector with silicon contacts (Step 550).

Figure 7A:
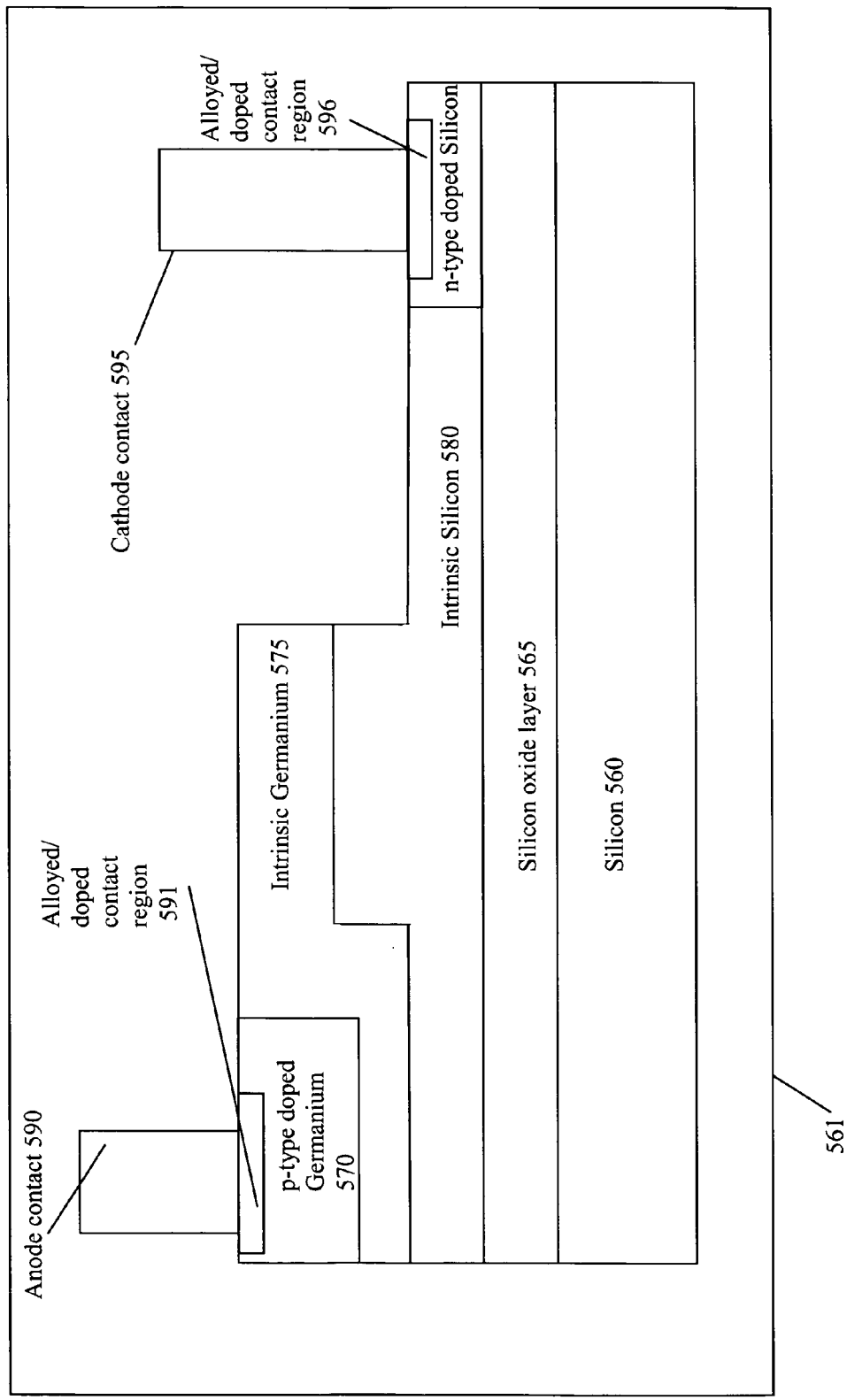
FIG. 7a illustrates an example of an integrated avalanche photodetector according to the current invention.
Figure 8A:
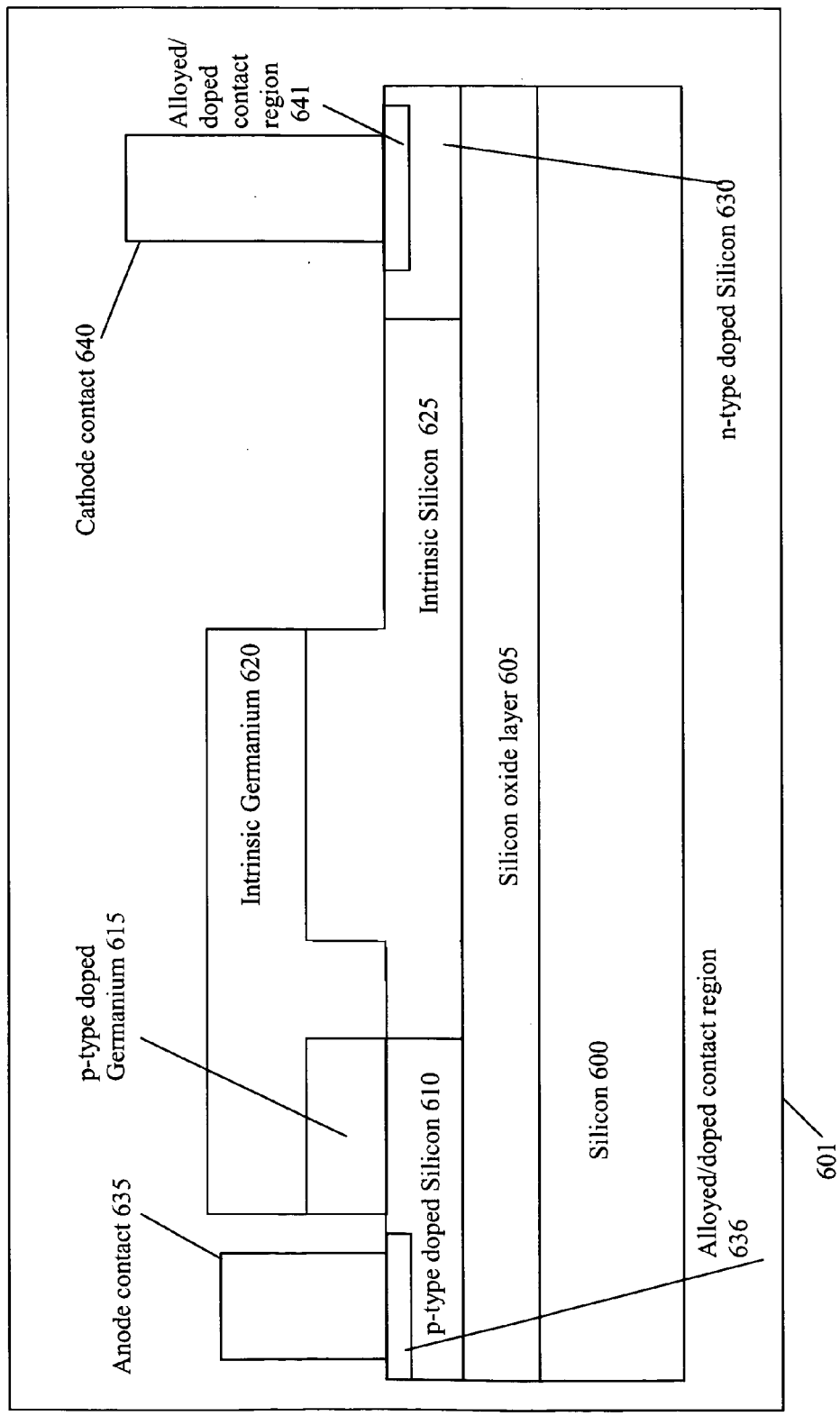
FIG. 8a illustrates an example of an integrated avalanche photodetector according to the current invention.

FIGS. 7a and 8a illustrate examples of integrated avalanche photodetectors 561 and 601 according to the current invention. According to the current invention, an integrated avalanche photodetector may be formed from a germanium silicon heterostructure. A germanium absorption region (such as 575 or 620) for absorbing photons is in contact with a silicon avalanche region (such as 580 and 625). Cathode contacts (such as 595 and 640) and anode contacts (such as 590 and 635) enable the application of a bias voltage across the heterostructure.

According to the current invention, an integrated avalanche photodetector comprises a germanium silicon heterostructure disposed on a substrate. In the examples illustrated in FIGS. 7a and 8a, the substrate is a silicon substrate. However, in other examples according to the current invention, other substrates may be used such as, but not limited to, a silicon-on-insulator (SOI) substrate or a silicon-on-sapphire (SOS) substrate.

According to the current invention, the silicon intrinsic region (such as 580 or 625) may comprise unintentionally doped silicon, lightly doped silicon, lightly p-doped silicon, lightly n-doped silicon, intrinsic silicon and/or un-doped silicon. Similarly, the germanium intrinsic regions (such as 575 and 620) may comprise unintentionally doped germanium, lightly p-doped germanium, intrinsic germanium and/or un-doped germanium.

In some examples of an integrated avalanche photodetector according to the current invention, a cathode contact 595 may be established to n-type doped silicon material 585 and an anode contact 590 may be established to p-type doped germanium material 570 as illustrated in FIG. 7a. However, according to another example of the current invention, both the anode contact and the cathode contact may be established to silicon material. In some cases, using only silicon contacts may make processing and/or CMOS process integration simpler. For example, an anode contact 635 may be established to silicon material such as p-type doped silicon region 610 in FIG. 8a. In this example, electrical contact is established from contact 635, through an alloyed/doped contact region 636, though p-type doped silicon region 610, through p-type doped germanium region 615 to the intrinsic germanium region 620. A low field collection region may be established in the intrinsic germanium region 620 and a high field avalanche region may be established in the intrinsic silicon region 625 when a reverse bias voltage is applied across the anode 635 and the cathode 640.

According to the current invention, a germanium layer is established over the silicon layer. In one example, a patterned passivation layer and/or mask may be used to establish a window on top of the silicon layer defining the region where the germanium for the germanium low field collection region may be grown. In some cases according to the current invention, the germanium layer may comprise one or more layers of germanium and may comprise single crystal germanium, polycrystalline germanium and/or amorphous germanium. In some cases, a thin layer of germanium may be grown slowly at a low temperature followed by a thicker layer of germanium grown quickly at a higher temperature. Furthermore, a variety of germanium deposition and/or growth techniques may be used such as, but not limited to, the selective area deposition of germanium. Note that in some cases, dopants may be introduced into adjacent silicon regions (such as p-type doped silicon region 610 disposed underneath p-type doped germanium region 615). Dopant diffusion into the silicon material 610 and dopant outdiffusion into the adjacent germanium material 615 occur during subsequent high temperature operations such as, but not limited to, germanium growth, cyclic annealing, contact annealing, and dopant activation.

In some cases, dopant outdiffusion from p-type doped silicon region 610 may provide the dopant source for some or all of the dopant content associated with p-type doped germanium region 615.

According the current invention, a variety of configurations are possible. FIGS. 9a, 9b, 10a and 10b illustrate examples of other configurations for avalanche photodetectors according to the current invention.

According to the current invention, the integrated avalanche photodetector may be coupled to an on-chip and/or off-chip light source. According to the current invention, waveguides may be coupled the germanium layer of the photodetector using evanescent and/or end-fire coupling. Depending on the configuration, external waveguides may be coupled through the top, edge and/or bottom surface of the substrate. According to the current invention, separate absorption and multiplication avalanche photodetector (SAM-APD) device or a separate absorption and multiplication waveguide avalanche photodetector (SAM-WAPD) device may be established based on a germanium silicon heterostructure.

Figure 7B:
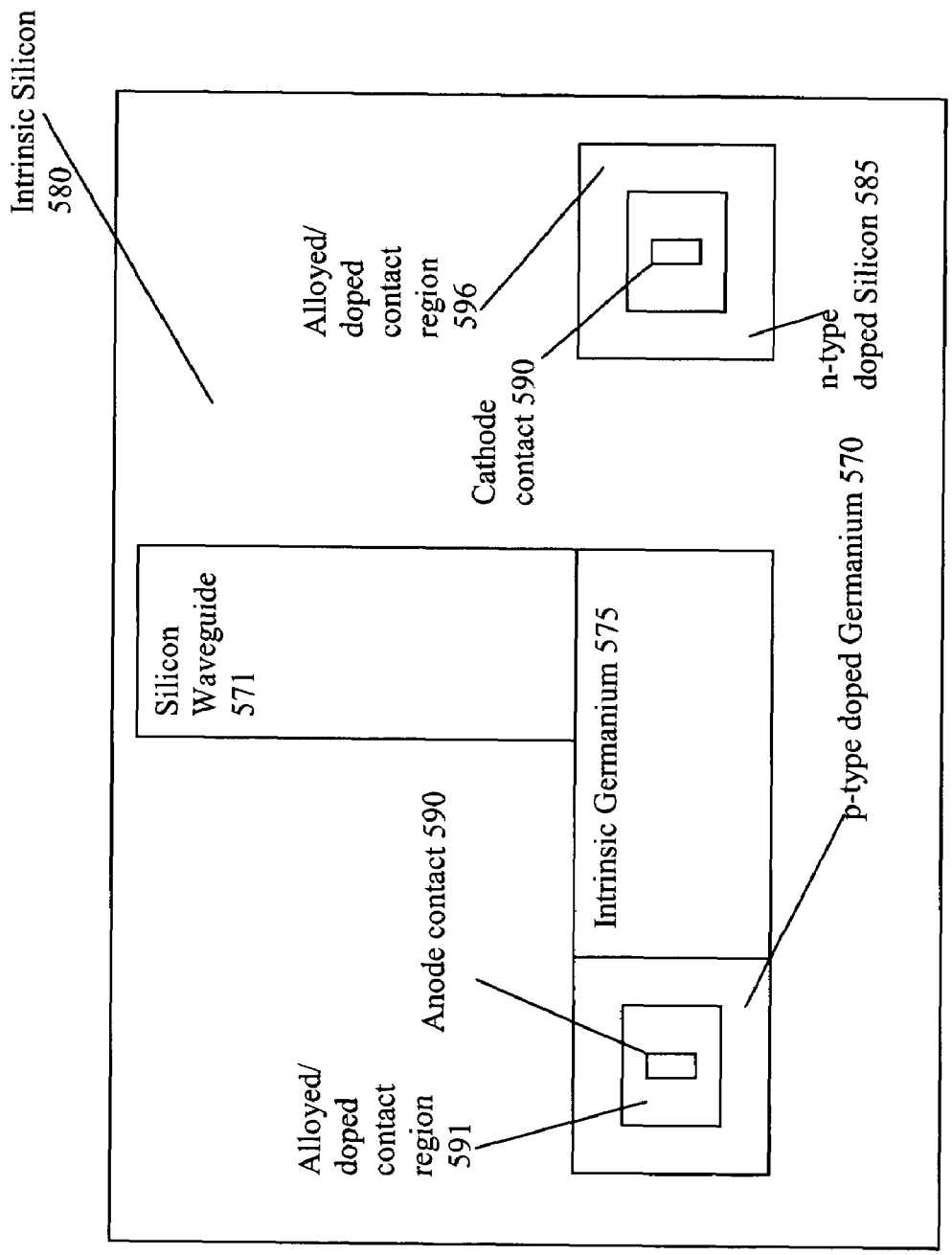
FIG. 7b illustrates an overhead view of an example of an integrated avalanche photodetector according to the current invention.
Figure 8B:
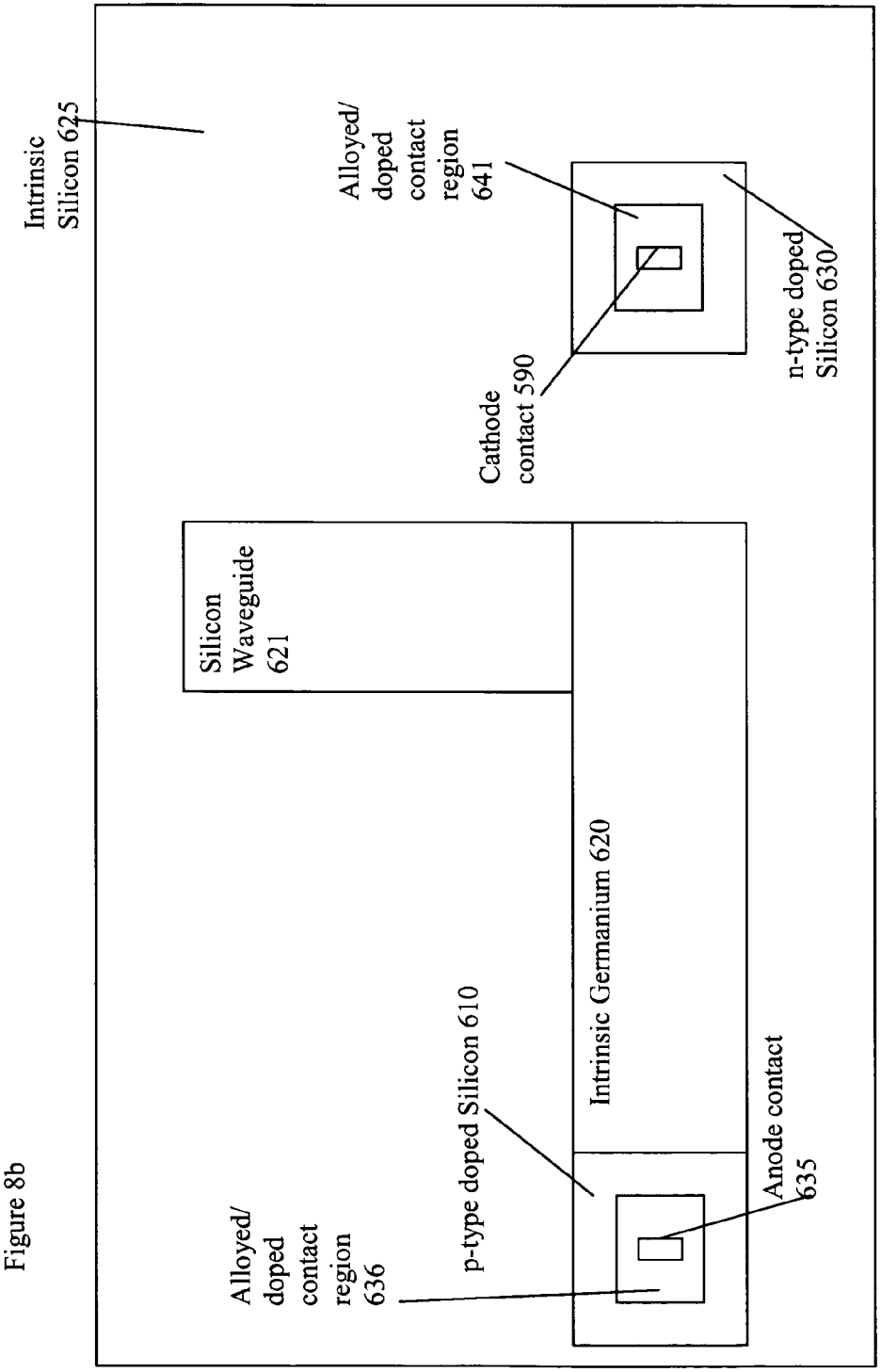
FIG. 8b illustrates an overhead view of an example of an integrated avalanche photodetector according to the current invention.
Figure 9A:
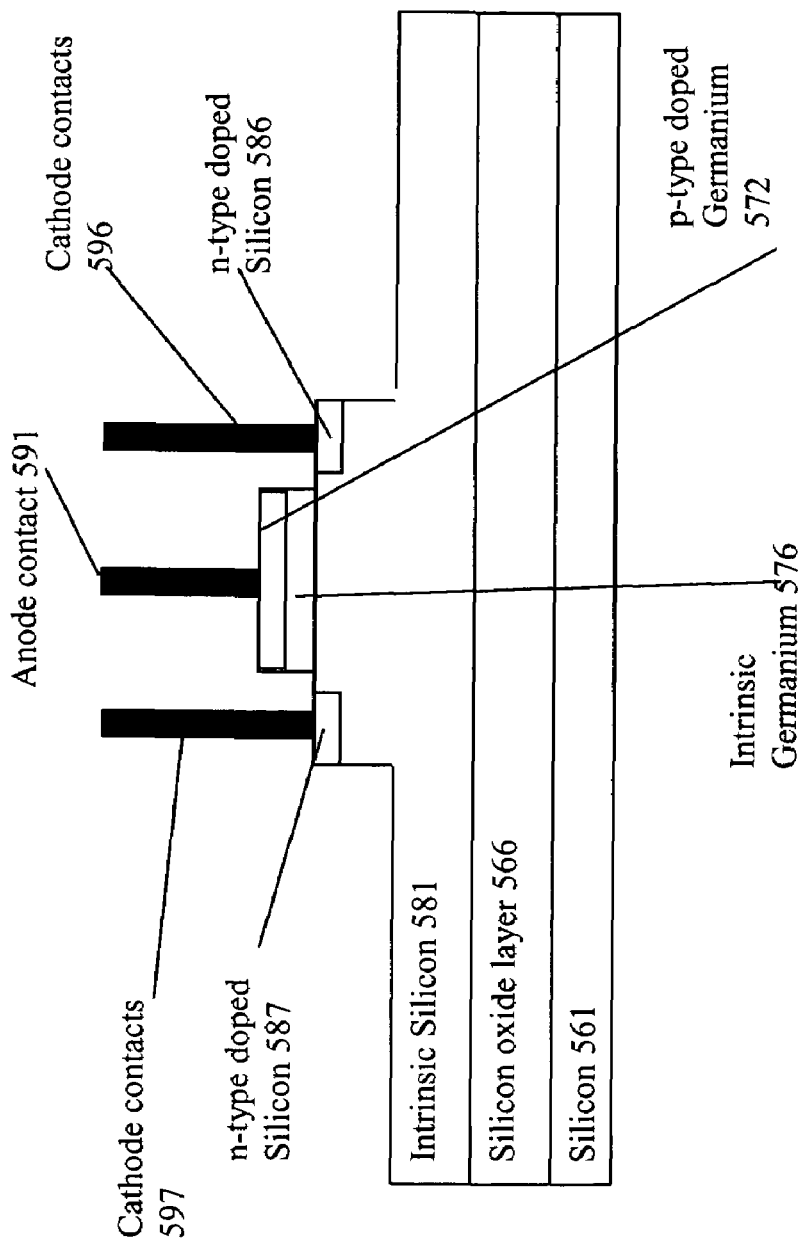
FIGS. 9a, 9b, 10a and 10b illustrate examples of other configurations for avalanche photodetectors according to the current invention.
Figure 9B:
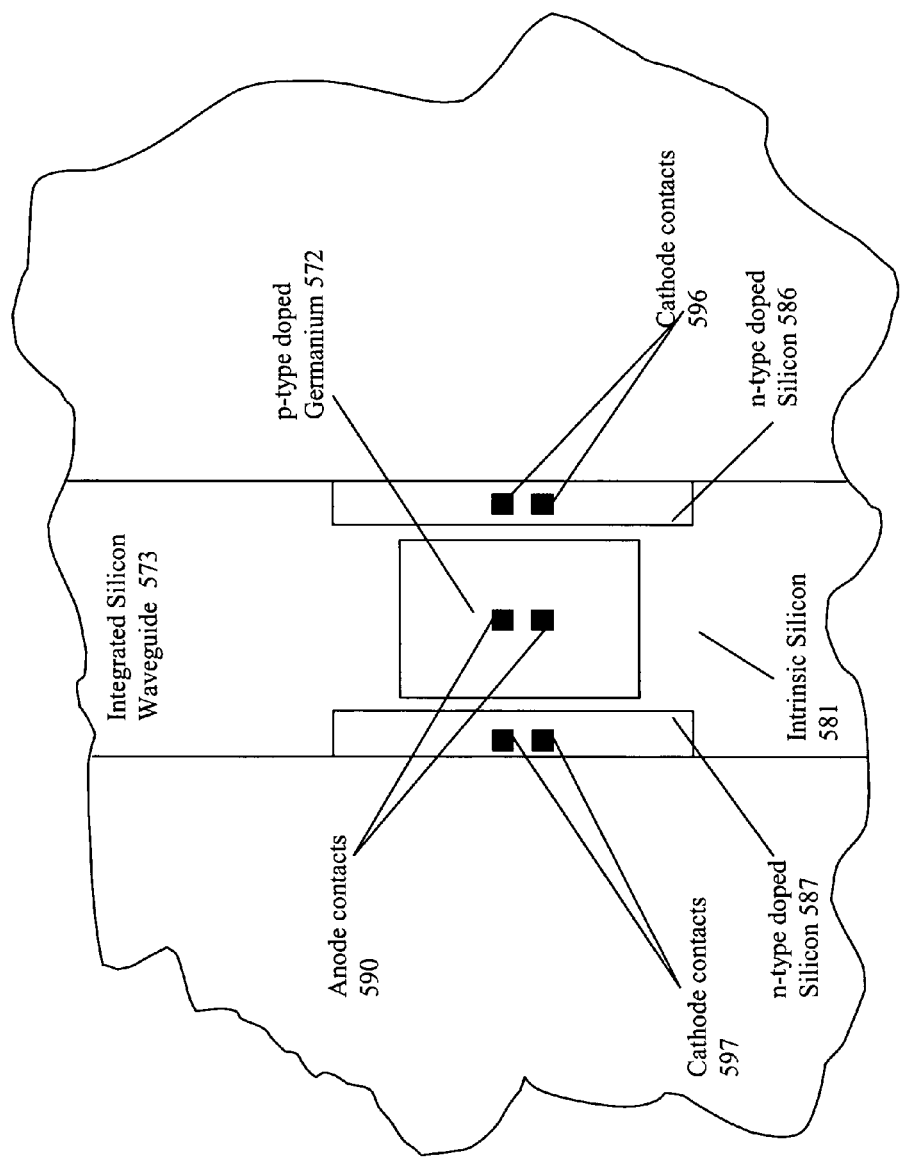
Figure 10A:
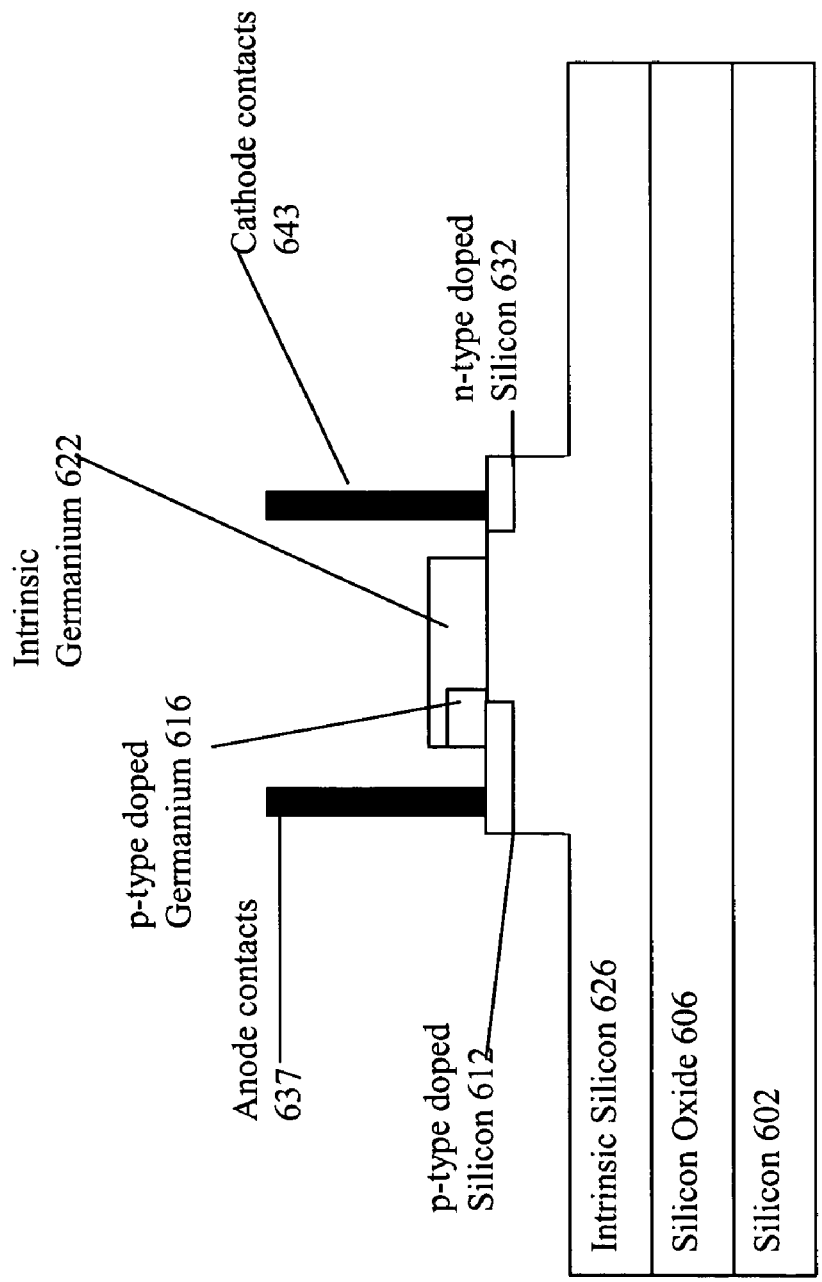
Figure 10B:
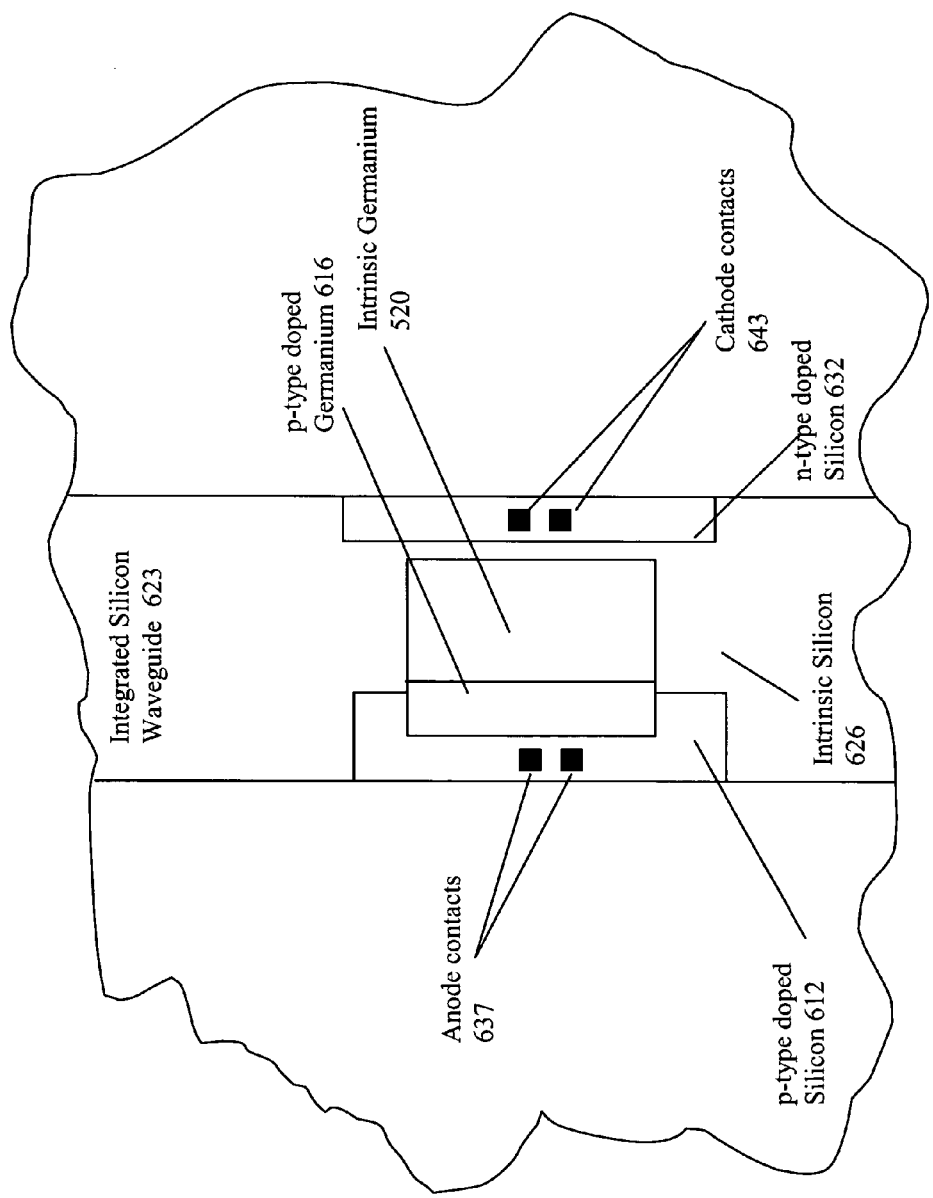

In some cases, an integrated avalanche photodetector according to the current invention may be integrated with an on-chip waveguide such as, but not limited to, an integrated silicon or silicon and germanium heterostructure optical waveguide. FIGS. 7b and 8b illustrate overhead views of two examples of integrated avalanche photodetectors according to the current invention. In some cases, some or all of the silicon and/or germanium associated with an integrated waveguide may be deposited, grown, patterned and/or doped concurrently in the same processing step(s) as some or all of the silicon and/or germanium which forms the detector's silicon avalanche region and/or the germanium absorption region. For example, in FIGS. 8a and 8b, integrated silicon waveguides 571 and 621 are optically coupled to and monolithically integrated with a waveguide according to the current invention.

According to the current invention, design rules may be established for devices comprising germanium, thereby enabling and/or enhancing the manufacturability of photodetectors comprising germanium in integrated CMOS devices.

Figure 11:
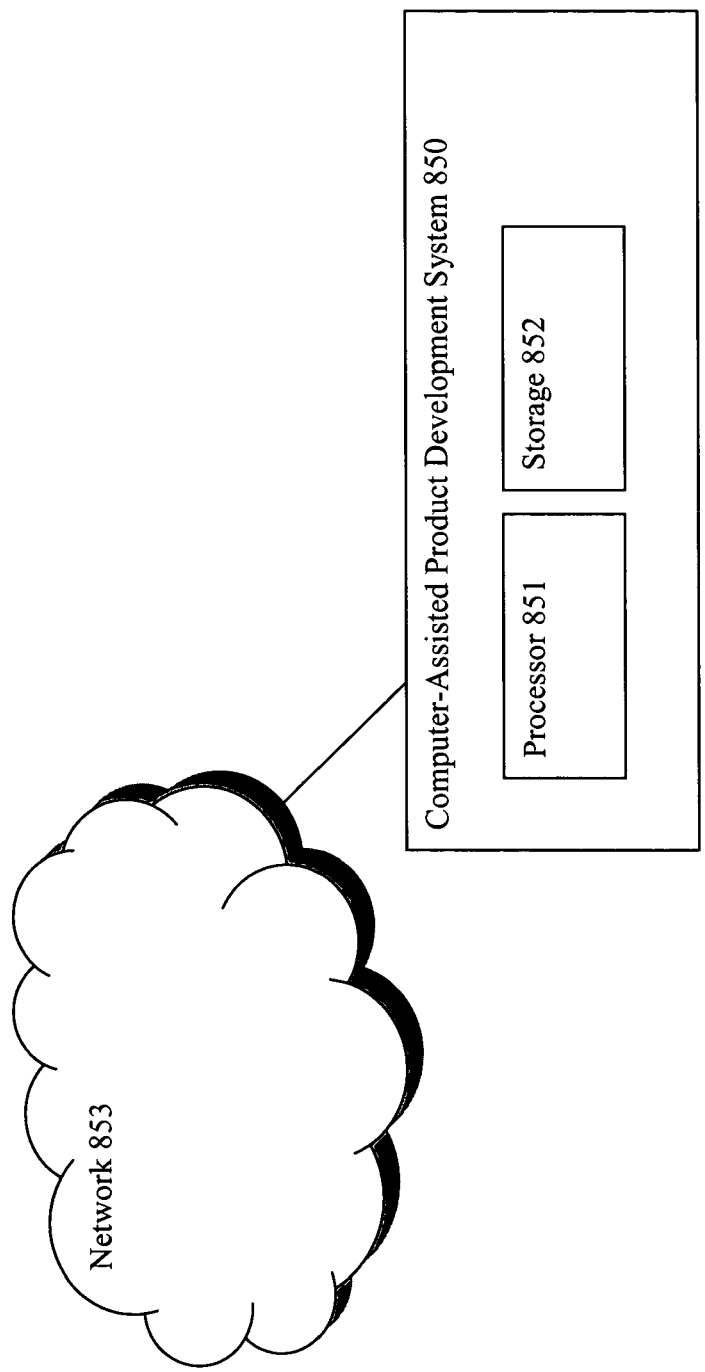
FIG. 11 illustrates an example of a computer-assisted product development system.

For example photodetectors comprising germanium such as, but not limited to, photodetectors comprising silicon and germanium heterostructures as well as the integrated avalanche photodetectors and the horizontal germanium silicon heterostructure photodetectors described above, may be designed for manufacture according to standard and/or custom CMOS processes. In some cases, design rules may be established to define allowable and/or recommended ranges for geometrical parameters related to the shapes defined in one or more mask layers; in some cases, design rules may be established to define allowable and/or recommend ranges for geometrical parameters related to the dimensions of actually constructed devices; in some cases, design rules may be based on geometrical parameters related to processing parameters used in the manufacture of the devices. FIG. 11 illustrates an example of a computer-assisted product development system 850. Typically, design rules may be used in conjunction with a computer-assisted product development system comprising a processor and storage. In some cases, design rules may be established based on processing constraints and/or device-oriented constraints. For example, design rules may be established based on processing constraints related to manufacturability and/or yield considerations; in some cases, design rules may be established based at least in part on avoiding physical configurations which may lead to inefficient or broken devices.

Figure 12:
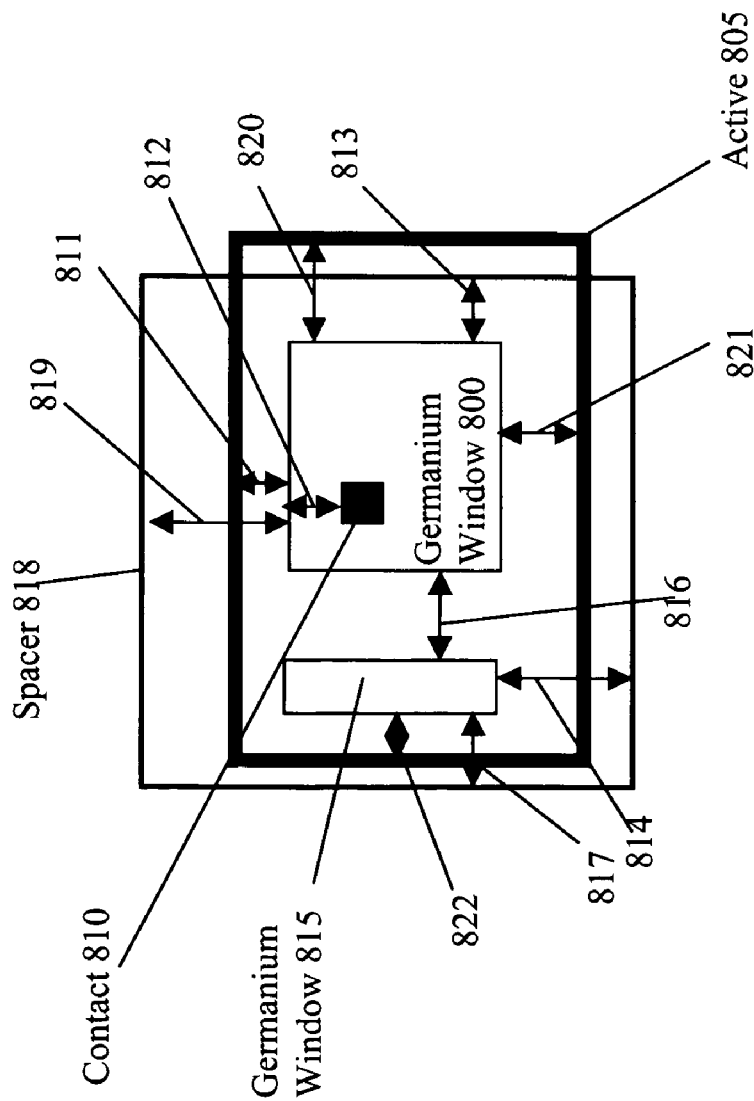
FIG. 12 is a layout of a device incorporating germanium windows.

In some cases, according to the current invention, devices comprising germanium may be integrated into CMOS processes using selective area growth techniques. For example, in some cases, a germanium growth mask such as a dielectric layer or a dielectric stack such as, but not limited to, a silicon oxynitride stack, may be patterned, forming windows, and used to define the selective area growth of layers comprising germanium. Design rules associated with the dimensions of those rectangular windows may be based, in part, to enable or improve the ability to controllably repeat: the trench excavation into the dielectric layers with an end-point on the underlying silicon surface and/or the establishment of substantially vertical sidewalls. Other consideration may be based on minimizing overetch in an underlying silicon layer and/or minimizing damage to an underlying silicon layer. In some cases, the windows may or may not be rectangular. For rectangular windows, a minimum window dimension may refer to the minimum length or width of the rectangular window. However, for non-rectangular windows, the minimum window dimension may refer to another characteristic length. For example, for a round or circular window, the minimum window dimension may refer to the diameter of the circle. For example, design rules may establish minimum germanium window dimensions in the range of 270-330 nm (nanometers) for actually constructed devices. Design rules may establish that mask dimensions enable the creation of germanium windows with a minimum dimension in the range of 270-330 nm; the actual mask dimensions may vary depending on the actual processes used. FIG. 12 is a layout of a device incorporating germanium windows 800 and 815. In this example, the minimum germanium window dimensions would refer to the minimum allowable dimensions of germanium windows 800 and 815 in the actually constructed device represented by this layout.

In some cases, a maximum germanium window dimension for the actually constructed devices may be established. In some cases, a maximum width may be established to minimize variation in the germanium layer deposited into the window; in some cases, establishing a maximum width may improve the uniformity of the germanium by minimizing loading effects associated with some germanium growth conditions. In some cases, the maximum width rule may apply to only one window dimension. For example, a rectangular window may be limited in only one dimension with a limited width proscribed by the design rule and an unlimited length. For example, design rules may establish maximum germanium window width in the range of 9-11 µm (micrometers) for actually constructed devices. Design rules may establish mask dimensions for creating devices with maximum germanium window width in the range of 9-11 µm (micrometers); the actual mask dimensions may vary depending on the processes used. Referring again to the example illustrated in FIG. 12, the maximum germanium window widths would refer to the maximum allowable widths of germanium windows 800 and 815 in the actually constructed device represented by this layout.

Note that the germanium windows illustrated in FIG. 12 are rectangular. In some cases, a design rule may be used to insure or recommend the use of parallelogram shaped germanium windows. However, in other examples according to the current invention, the shape of the germanium windows may or may not be limited to parallelograms. In some cases, other design rules may be used to enforce, exclude or recommend particular shapes for the germanium window.

In some cases, a design rule may establish a minimum distance between adjacent germanium windows. For example, in some cases, the minimum distance between adjacent devices may be established in order to minimize loading or starving effects which are sometimes associated with closely spaced growth areas. Design rules may establish a minimum distance between adjacent germanium windows in the range of 16-20 µm (micrometers) for actually constructed devices. A design rule may establish mask dimensions for creating devices with a minimum distance between adjacent germanium windows in the range of 16-20 µm (micrometers); the actual mask dimensions may vary depending on the processes used. Referring again to the example illustrated in FIG. 12, minimum distance between adjacent germanium windows would refer to the minimum distance indicated by arrow 816 in the actually constructed device represented by this layout.

In some cases, a design rule may establish limits for the maximum and/or minimum total area which may be covered by germanium windows compared to the overall wafer area. For example, in some cases, the minimum percent coverage of a germanium window may be established in order to support consistent and/or reliable end-point detection during trench etching. A design rule may establish a minimum percent coverage of a germanium window in the range of 0.4-1% for actually constructed devices. A design rule may establish mask dimensions for creating devices with a minimum percent coverage of a germanium window in the range of 0.4-1%; the actual mask dimensions may vary depending on the processes used. In some cases, the maximum percent coverage of a germanium window may be established in order to avoid long-range loading effects. A design rule may establish a maximum percent coverage of a germanium window in the range of 8-12% for actually constructed devices. A design rule may establish mask dimensions for creating devices with a maximum percent coverage of a germanium window in the range of 8-12%; the actual mask dimensions may vary depending on the processes used.

In some cases, the germanium windows may or may not be rectangular. For example, in some cases, the germanium window may comprise other shapes such as, but not limited to, a triangle or a taper. A design rule may establish rules associated with the minimum angle for these shapes. For example, in some cases, acute angles may be difficult to etch properly, resulting in malformed shapes. A design rule may establish a minimum angle aperture for germanium windows in the range of 40-50 degrees for actually constructed devices. A design rule may establish mask dimensions for creating devices with a minimum angle aperture for germanium windows in the range of 40-50 degrees; the actual mask dimensions may vary depending on the processes used.

In some cases, a design rule may establish rules associated with the relative positioning of the germanium window opening with respect to one or more other shapes disposed in other layers. For example, in some cases, a dielectric stack disposed on a silicon layer is patterned to define the selective growth area for a germanium layer. In some cases, this stack may comprise (starting from the bottom layer of the stack in contact with the silicon layer) a layer of undoped silicon oxide, a layer of silicon oxynitride sometimes referred to as a spacer, a layer of silicon oxynitride sometimes referred to as a contact punch through layer and a layer of silicon oxide. A design rule may establish that the germanium window opening must be enclosed by all layers of the dielectric stack such as, but not limited to the spacer shape which defines the shape of the spacer layer. In some cases, the minimum spacer enclosure distance may be further defined. In some cases, this may help prevent slivers. The minimum spacer enclosure distance is the minimum distance between the edge of a germanium window and the outer edge of the spacer shape. Referring again to the example illustrated in FIG. 12, minimum spacer enclosure distance would refer to the minimum allowable distance indicated by arrows such as 813, 814, 817 and 819 in the actually constructed device represented by this layout. A design rule may establish a minimum spacer enclosure distance in the range of 0.4 to 0.6 µm for actually constructed devices. A design rule may establish mask dimensions for creating devices with a minimum spacer enclosure distance in the range of 0.4 to 0.6 µm; the actual mask dimensions may vary depending on the processes used.

In some cases, a design rule may be established to insure that the germanium window opening is enclosed in an active layer shape. For devices with integrated silicon waveguides, the integrated silicon waveguides may be disposed in the layer of silicon material comprising the active layer; for wafers with integrated silicon CMOS devices, one or more silicon devices may be disposed in the active layer. This is another example of a design rule associated with the relative positioning of the germanium window opening with respect to one or more other shapes disposed in other layers. Establishing a minimum active enclosure distance design rule to insure that the germanium window is enclosed in the active layer shape may help insure that the dielectric stack is disposed on a silicon surface. The minimum active enclosure distance is the minimum distance between the edge of a germanium window and the outer edge of the active shape. Referring again to the example illustrated in FIG. 12, minimum enclosure distance would refer to the minimum allowable distance indicated by arrows such as 820, 821, 822 in the actually constructed device represented by this layout. A design rule may establish that the minimum active enclosure distance in the range of 0.16 to 0.2 µm for actually constructed devices. A design rule may establish mask dimensions for creating devices with a minimum active enclosure distance in the range of 0.16 to 0.2 µm; the actual mask dimensions may vary depending on the processes used.

Figure 13:
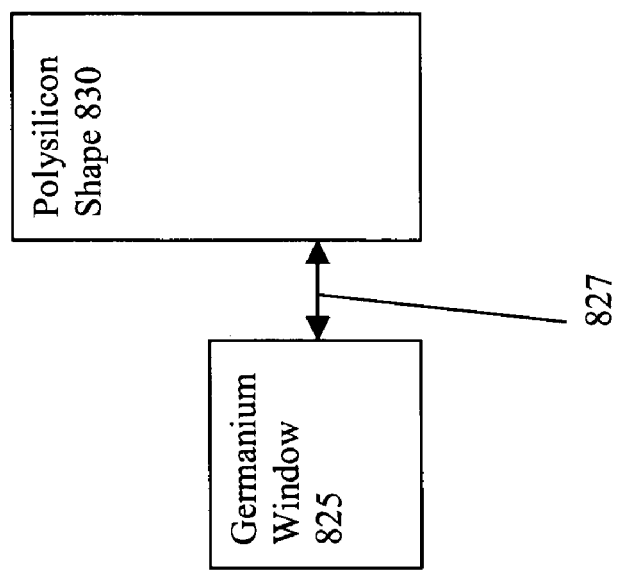
FIG. 13 is an example layout illustrating the polysilicon to germanium distance between a germanium window and a polysilicon shape.

In some cases, a design rule may be established to insure that a minimum distance is maintained between polysilicon shapes, possibly in other layers, and the germanium window opening. This is another example of a design rule associated with the relative positioning of the germanium window opening with respect to one or more other shapes disposed in other layers. In some cases, establishing a minimum germanium to polysilicon distance design rule may help minimize topological problems associated with a germanium window opening etch in the region of the germanium window and thereby improve yields. The polysilicon to germanium minimum distance is the minimum distance between the edge of a germanium window and the outer edge of a polysilicon shape in actually constructed devices. FIG. 13 is an example layout illustrating the polysilicon to germanium distance 827 between germanium window 825 and polysilicon shape 830. A design rule may establish a polysilicon to germanium minimum distance in the range of 0.16 and 0.2 µm for actually constructed devices. A design rule may establish mask dimensions for creating devices with a polysilicon to germanium minimum distance in the range of 0.16 and 0.2 µm; the actual mask dimensions may vary depending on the processes used.

Figure 14:
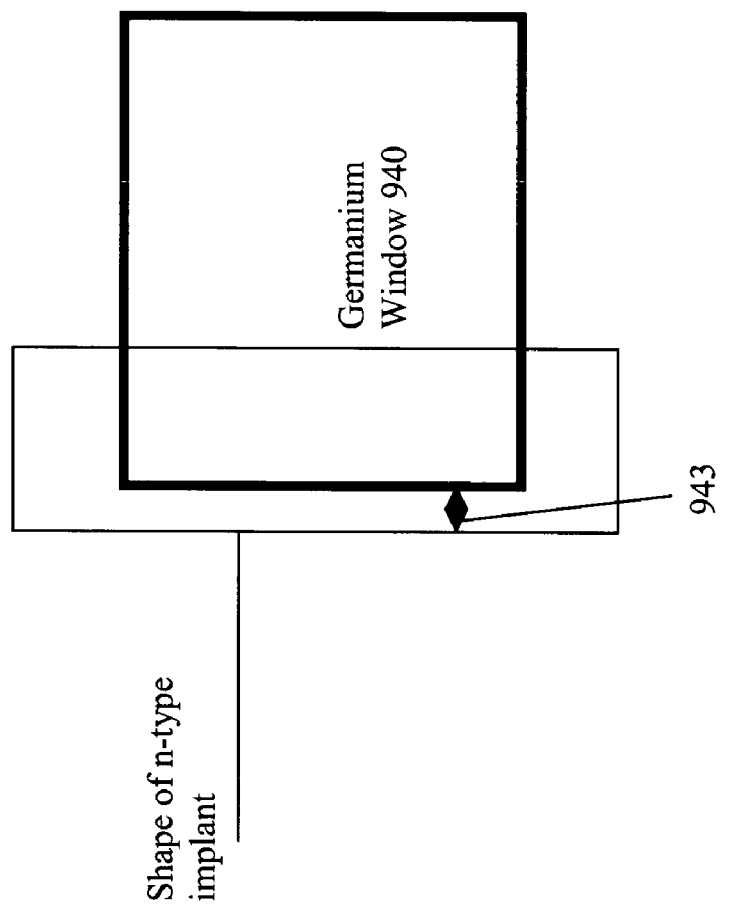
FIGS. 14 and 15 illustrate examples of the minimum implant enclosure distance.
Figure 15:
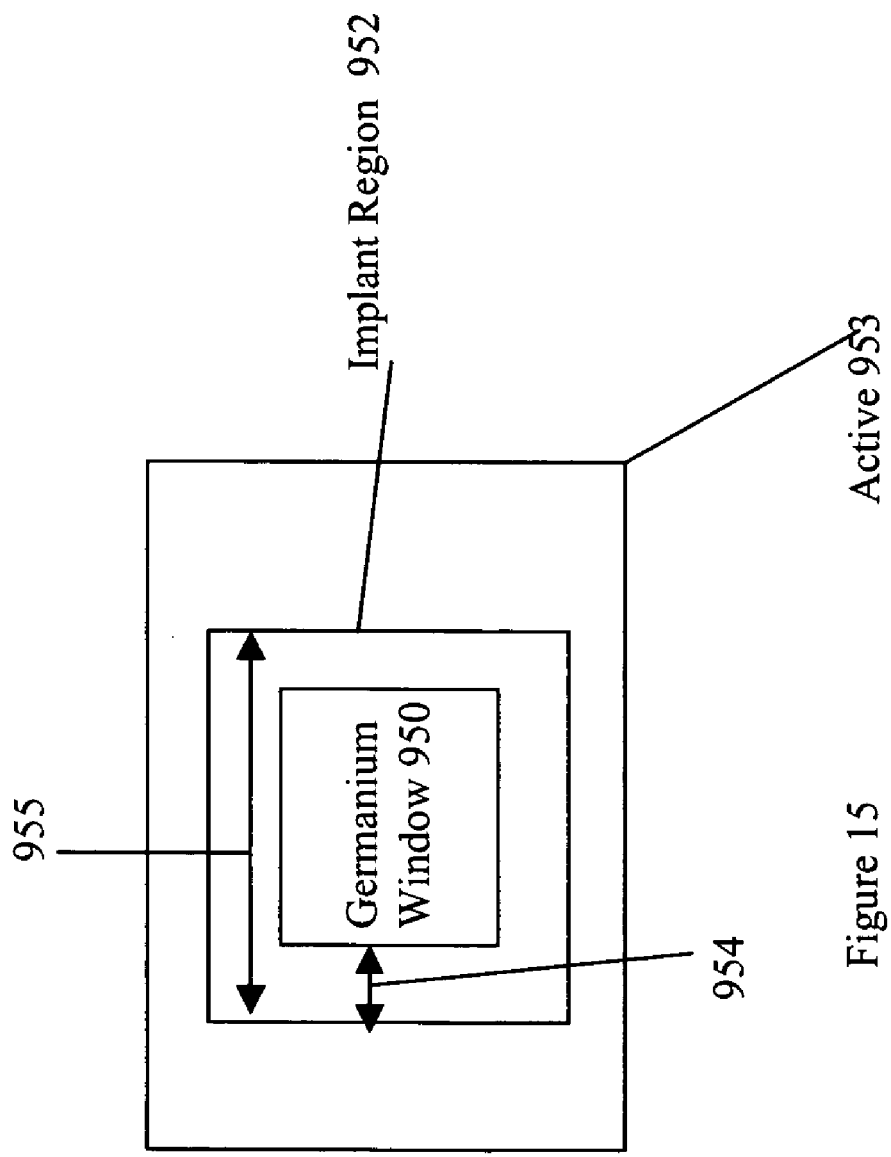

In some cases, a design rule may be established to insure that patterning steps associated with establishing deep implants enclose one edge of the germanium window opening. This is another example of a design rule associated with the relative positioning of the germanium window opening with respect to one or more other shapes disposed in other layers. The minimum implant enclosure distance design rule is the minimum distance between an edge of a germanium window and the outer edge of the implant shape. FIGS. 14 and 15 illustrate examples of the minimum implant enclosure distance. Referring to FIG. 14, the minimum implant enclosure distance is indicated by arrow 943; in FIG. 15, another example of the minimum implant enclosure distance is illustrated by arrow 954. A design rule may establish a minimum implant enclosure distance in the range of 50 and 70 nm (nanometers) for an actually constructed device. A design rule may establish mask dimensions for creating devices with a minimum implant enclosure distance in the range of 50 and 70 nm; the actual mask dimensions may vary depending on the processes used. In some cases, the same design rule may be applied for regions incorporating either n-type or p-type dopants. However, in some cases, design rules may be established per doping type and/or doping level.

In some cases, a design rule may establish a minimum thickness for germanium layers. For example, in some cases, the minimum thickness of a germanium layer may be established in order to insure consistently reproducible germanium layers. A design rule may establish a minimum germanium layer thickness in the range of 18 to 22 nm for actually constructed devices.

In some cases, a design rule may establish a maximum thickness for germanium layers in actually constructed devices. For example, in some cases, the maximum thickness of a germanium layer may be established when it is desirable to use a single process to simultaneously establish contact to source/drain and/or gate when establishing contact to the germanium layer. In some cases, if the germanium layer is too thick, developing a reliable single etch process may be difficult; this may be especially true if the required etch depths for the germanium layer, source/drain and/or gate are very different. A design rule may establish a process related maximum germanium thickness in the range of 250 to 400 nm for actually constructed devices.

In some cases, a device based design rule related to the maximum germanium thickness may be used in addition to a processing based design rule. From a device perspective, the ability of a germanium detector to absorb light over a short distance may be related to the thickness of the germanium.

For example, in some cases, a thicker germanium layer may improve the ability of a germanium detector to absorb light over a short distance; however, in some cases, this efficiency drops off beyond a certain thickness. A design rule may establish a device related maximum germanium thickness in the range of 0.4 to 0.6 μm for actually constructed devices.

In some cases, a device based design rule related to the minimum germanium thickness may be used in addition to a processing based design rule. From a device perspective, the ability of a germanium detector to absorb light over a short distance may be related to the thickness of the germanium layer. For example, in some cases, a very thin germanium layer may imply the need for a very long device with a correspondingly large dark current and high capacitance. A design rule may establish a device related minimum germanium thickness in the range of 0.1 to 0.2 μm for actually constructed devices. A design rule may establish process parameters such as, but not limited to, substrate temperature, deposition time, chamber pressure and gas dilution, for creating devices with a device related minimum germanium thickness in the range of 0.1 to 0.2 μm.

Figure 16:
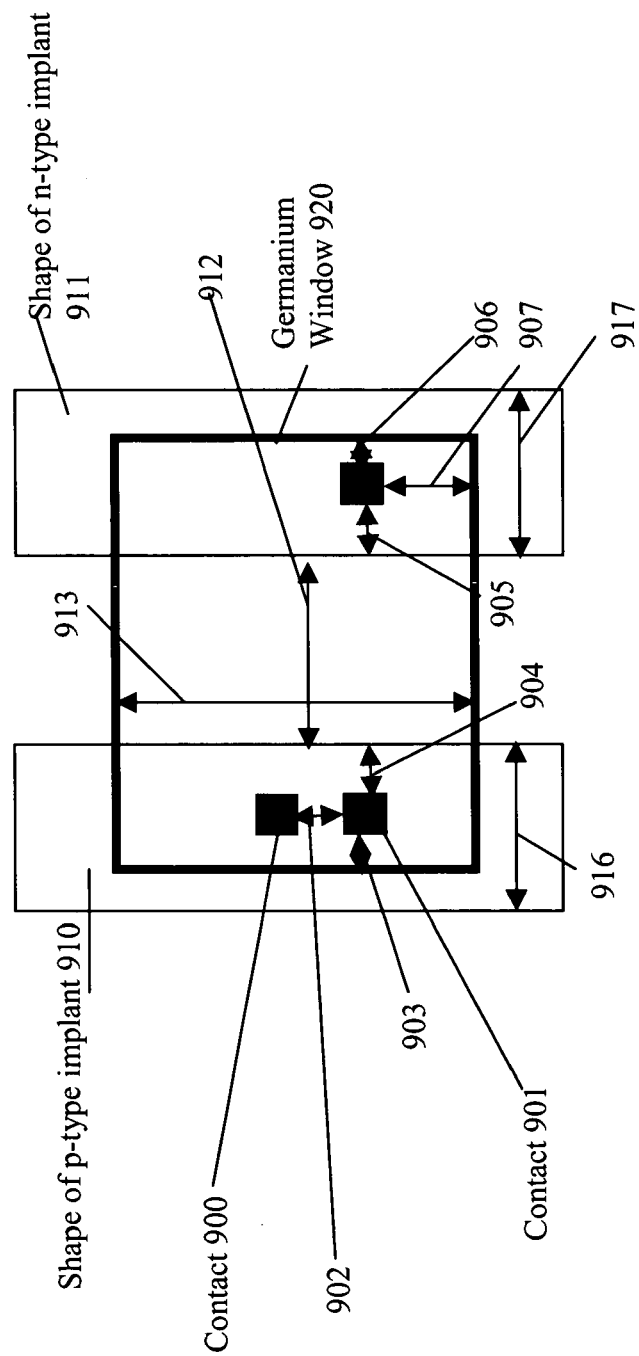
FIG. 16 is a layout of an example of horizontal germanium silicon heterostructure photodetector according to the current invention.

In some cases, a design rule may establish minimum in-plane sizes for doped regions of the germanium and/or adjacent silicon layer. In some cases, this may be established based on restrictions associated with the masks used for these patterning steps. FIG. 16 is a layout of an example of horizontal germanium silicon heterostructure photodetector according to the current invention. In this example, doped regions such as 910 and 911 represent the shapes for implanting dopants for introduction into the germanium layer. In this example, arrow 916 represents the minimum in-plane dimension of a p-type doped region in the actually constructed device represented by this layout; arrow 917 represents the minimum in-plane dimension of an n-type doped region in the actually constructed device represented by this layout. A design rule may establish a minimum in-plane dimension for the p-type doped germanium region in the range of 0.35 to 0.45 μm for actually constructed devices; in some cases, another design rule may establish a minimum in-plane dimension for the n-type doped germanium region in the range of 0.35 to 0.45 μm for actually constructed devices. A design rule may establish mask dimensions for creating devices with a minimum in-plane dimension for the n-type doped germanium region in the range of 0.35 to 0.45 μm; the actual mask dimensions may vary depending on the processes used. A design rule may establish mask dimensions for creating devices with a minimum in-plane dimension for the p-type doped germanium region in the range of 0.35 to 0.45 μm; the actual mask dimensions may vary depending on the processes used.

In some cases, a design rule may establish a minimum area for doped germanium regions. In some cases, this may be due to mask and processing considerations. Referring to the example illustrated in FIG. 16, doped regions such as 910 and 911 represent regions where dopants will be implanted for introduction into the germanium layer. A design rule may establish a minimum area for the p-type doped germanium region in the range of 0.35-0.45 $\mu m^2$ for actually constructed devices; in some cases, a design rule may establish that actually constructed devices have a minimum area for the n-type doped germanium region in the range of 0.35-0.45 $\mu m^2$. A design rule may establish mask dimensions for creating devices with a minimum area for the n-type doped germanium region in the range of 0.35-0.45 $\mu m^2$; the actual mask dimensions may vary depending on the processes used. A design rule may establish mask dimensions for creating devices with a minimum area for the p-type doped germanium region in the range of 0.35-0.45 $\mu m^2$; the actual mask dimensions may vary depending on the processes used.

Figure 17:
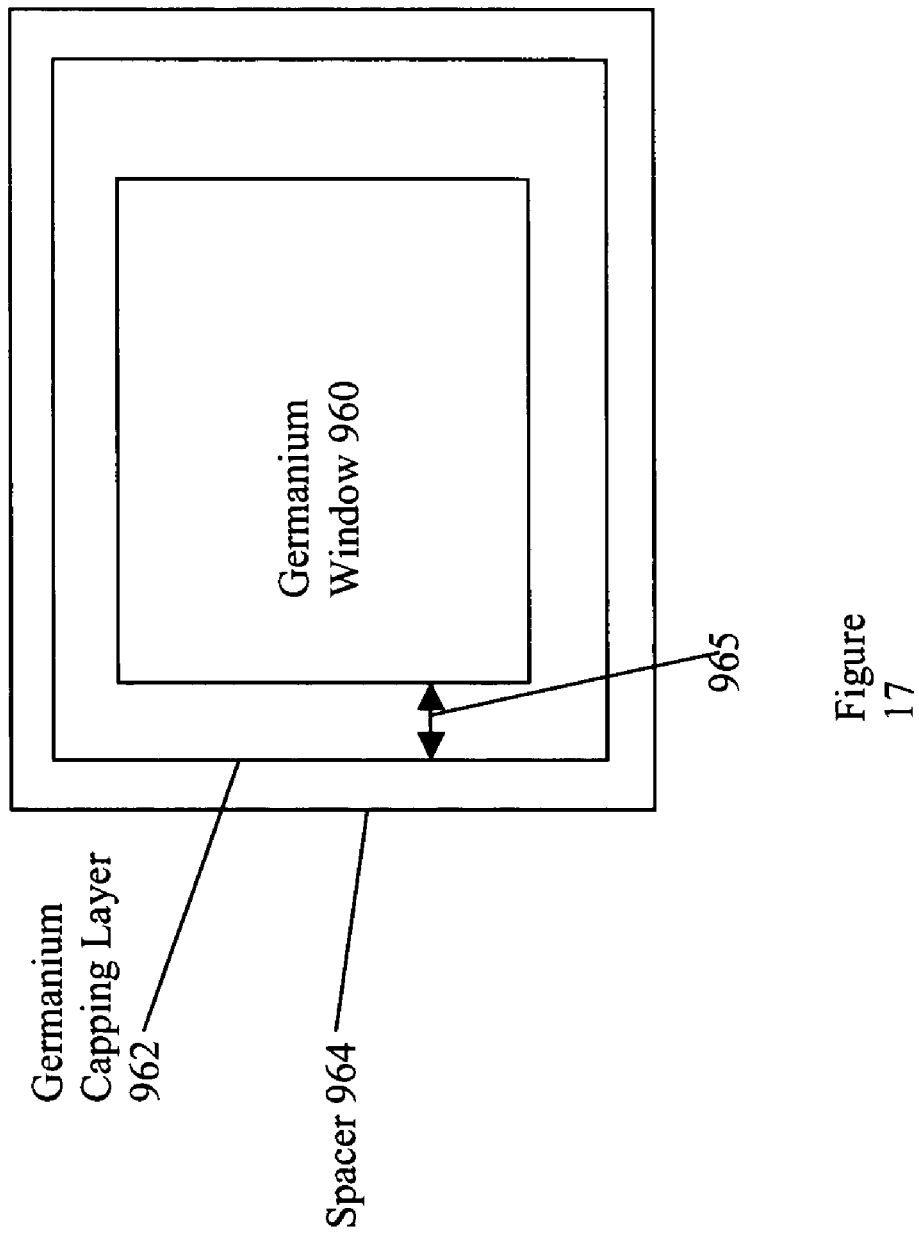
FIG. 17 is an example of a layout illustrating a germanium window, capping layer and spacer.

In some cases, a design rule may establish a minimum size for the germanium capping layer shape. In some cases, the minimum dimensions of the germanium capping layer may be established by scaling up the size of the germanium window. In some cases, a minimum distance between the edge of the germanium window and the edge of the capping layer shape may be established. FIG. 17 is an example of a layout illustrating a germanium window 960, capping layer shape 62 and spacer 964. In this example, arrow 965 illustrates the capping layer window enclosure distance. A design rule may establish a minimum capping layer window enclosure distance in the range of 400 to 700 nm for actually constructed devices. A design rule may establish mask dimensions for creating devices wherein the minimum capping layer window enclosure distance in the range of 400 to 700 nm; the actual mask dimensions may vary depending on the processes used. In the example illustrated in FIG. 17, the germanium window is a parallelogram centered in the capping layer. In some cases, design rules may enforce or recommend this configuration. However, in other examples according to the current invention, other configurations may be allowed.

For contacts to germanium layers in germanium p-i-n junctions, the contacts must be enclosed in shapes that define doping implants. (Note that these constraints would not apply to Schottky devices.) Referring to FIG. 16, regions 910 and 911 represent doped regions. In this example, contacts must be enclosed in an area where a doped region (such as 910 or 911) overlaps with the germanium window 912. Arrow shapes 902, 903, 904, 905, 906, and 907 illustrate example horizontal and vertical dimensions characterizing the doping region enclosure distance for the germanium contacts. In some cases, a design rule may establish a minimum doping region enclosure distance for the germanium contacts in order to relax mask alignment requirements. In some cases, various design rules associated with the germanium contacts may be established to match related design rules associated with silicon contacts. A design rule may establish a minimum doping region enclosure distance for the germanium contacts in the range of 50 to 70 nm for actually constructed devices. A design rule may establish mask dimensions for creating devices where the minimum doping region enclosure distance for the germanium contacts is in the range of 50 to 70 nm; the actual mask dimensions may vary depending on the processes used.

In some cases, a detector comprising germanium may comprise an integrated germanium waveguide. In some examples, the minimum length of the waveguide may be chosen to insure that a minimum level of absorption may occur. However, the maximum length may be chosen to limit the impact of dark current and capacitance associated with the waveguide, which may impair sensitivity and/or speed. For some photodetectors, this dimension corresponds to the length of the germanium window. For the photodetector layout illustrated in FIG. 16, the waveguide length corresponds to the length of the germanium window indicated by arrow 913 in an actually constructed device. A design rule may establish maximum and/or minimum integrated germanium waveguide length ranges for actually constructed devices. A design rule may establish mask dimensions for creating devices with maximum and/or minimum integrated germanium waveguide lengths.

In some cases, a detector comprising germanium may comprise a curved integrated germanium waveguide. Because a small curvature radius may introduce scattering losses which can impair detector sensitivity, a minimum radius of curvature may be established for curved integrated germanium waveguides. A design rule may establish a minimum radius of curvature for an integrated germanium waveguide must be in the range of 10 to 15 µm for actually constructed devices. A design rule may establish mask dimensions for creating devices with a minimum radius of curvature integrated germanium waveguide lengths in the range of 10 to 15 µm; the actual mask dimensions may vary depending on the processes used.

In some cases, a detector comprising germanium may have a tapered shape. In some cases, this shape may be used to optimize coupling from a silicon waveguide to an integrated germanium waveguide detector. However, in some cases, photocarriers generated in the taper far from the contacts may be lost. A design rule may establish a maximum taper length in the range of 0.5 to 0.7 µm for actually constructed devices. A design rule may establish mask dimensions for creating devices with a maximum taper length of 0.5 to 0.7 µm; the actual mask dimensions may vary depending on the processes used.

In some cases, outdiffusion regions in silicon are used to dope adjacent germanium material. For example, referring to FIG. 1, a germanium p-i-n may be formed without the need for implantation in the germanium material 130 or 140 by relying on outdiffusion from adjacent doped silicon regions 110 and 120. A design rule may be established to insure a minimum overlap corresponding to the overlap between silicon region 100 and germanium region 130. In some cases, this may improve responsivity in the actually constructed devices by establishing low series resistance. A design rule may establish a minimum outdiffusion overlap in the range of 0.5 to 0.7 µm for actually constructed devices. A design rule may establish mask dimensions for creating devices with a minimum outdiffusion overlap in the range of 0.5 to 0.7 µm; the actual mask dimensions may vary depending on the processes used.

In some cases, the photoresponse at short circuit, the device speed and/or the device yield may be impacted by the number of contacts. In some cases, it is advantageous to use the contacts to the germanium layer that are the same size and shape as the contacts to silicon material in other regions of the integrated CMOS device. A design rule may be established to insure a that the contacts to germanium layers match the silicon contacts in other regions of the integrated CMOS device. In some cases, a design rule may establish a minimum number of contacts per detector electrode in contact with germanium in the range of 4 to 6 contacts. A design rule may establish mask specifications for creating devices with a minimum number of contacts per detector electrode in contact with germanium in the range of 4 to 6 contacts.

In some cases, contacts may be disposed on top of doped germanium regions. In some cases, the minimum dimensions of the contact to the germanium window may be established to match the minimum contact dimension design rules for silicon contacts. In FIG. 16, contacts 900, 901 and 908 are square and the minimum contact dimension design rule would refer to the length of one edge of the square contacts. In other examples, the contacts may or may not be square; for example, in a rectangular contact, a minimum contact dimension would refer to the width and/or length of the rectangular contact. In some cases, a design rule may establish a minimum contact dimension for contacts to a germanium region in the range of 0.16 to 0.20 µm in actually constructed devices. A design rule may establish mask dimensions for creating devices where the minimum contact dimension for contacts to a germanium region in the range of 0.16 to 0.2 µm; the actual mask dimensions may vary depending on the processes used.

In some cases, design rules may be established to enforce or recommend the shape of contacts disposed on top of doped germanium regions. For example, in some cases, a design rule may be established requiring or recommending square contacts to germanium regions in actually constructed devices. A design rule may establish a requirement or recommendation for creating devices where all contacts to germanium regions are square shaped; the actual shapes created on the mask may vary depending on the processes used.

In some cases, design rules may be established to enforce or recommend the arrangement of contacts disposed on top of doped germanium regions in orthogonal patterns with respect to a grid, with no contact rotation with respect to a grid. For example, in some cases, a design rule may be established requiring or recommending orthogonally arranged contacts to germanium regions in actually constructed devices. A design rule may establish a requirement or recommendation for creating devices where all contacts to germanium regions are orthogonally ranged; the actual arrangement of shapes created on the mask may vary depending on the processes used.

In some cases, contacts may be disposed on top of doped germanium regions. In some cases, design rules may be established to enforce or recommend minimum contact-to-contact distances for contacts to germanium windows. In FIG. 16, arrow 902 indicates the contact-to-contact distance between contacts 900 and 901. In some cases, a design rule may establish a minimum contact-to-contact distances for contacts to germanium windows in the range of 0.16 to 0.20 µm in actually constructed devices. A design rule may establish mask dimensions for creating devices where the minimum contact-to-contact distance for contacts to germanium windows is in the range of 0.16 to 0.20 µm; the actual mask dimensions may vary depending on the processes used.

In some cases, a two dimensional array of contacts may be disposed on top of doped germanium regions. In some cases, design rules may be established to enforce or recommend minimum contact-to-contact distances for rows and columns in a two dimensional array. In some cases, for two dimensional arrays of contacts, a design rule may establish a minimum contact-to-contact distance within a row of contacts to germanium windows in the range of 0.16 to 0.20 µm in actually constructed devices. A design rule may establish mask dimensions for creating devices with two dimensional arrays of contacts wherein a minimum contact-to-contact distance within a row of contacts to germanium windows is established in the range of 0.16 to 0.20 µm; the actual mask dimensions may vary depending on the processes used. In some cases, for two dimensional arrays of contacts, a design rule may establish a minimum contact-to-contact distance within a column of contacts to germanium windows in the range of 0.21 to 0.27 µm in actually constructed devices. A design rule may establish mask dimensions for creating devices with two dimensional arrays of contacts wherein a minimum contact-to-contact distance within a column of contacts to germanium windows is established in the range of 0.21 to 0.27 µm; the actual mask dimensions may vary depending on the processes used.

In some cases, a germanium window may be established with n-type doped and p-type doped regions. In some cases, a design rule may be established to enforce or recommend a minimum distance between these regions. In FIG. 16, arrow 912 refers to an example of the distance between an n-type doped and p-type doped region on a germanium window 920. In some cases, a design rule may establish a minimum distance between an n-type doped region on a germanium window and a p-type doped region on a germanium window in the range of 0.2 to 0.3 µm in actually constructed devices. A design rule may establish mask dimensions for creating devices with a minimum distance between an n-type doped region on a germanium window and a p-type doped region on a germanium window in the range of 0.2 to 0.3 µm; the actual mask dimensions may vary depending on the processes used.

Foregoing descriptions of specific embodiments of the invention have been presented for purposes of illustration and description. They are not intended to be exhaustive or to limit the invention to the precise forms disclosed. Modifications and variations are possible in light of the above teaching.

The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

We claim:

1. A horizontal germanium silicon photodetector integrated on a substrate comprising:
    a horizontal silicon pin (positive-intrinsic-negative) diode disposed on a substrate comprising:
        a first positive region comprising p-type doped silicon;
        a first intrinsic region comprising silicon; and,
        a first negative region comprising n-type doped silicon;
    a horizontal germanium pin diode disposed on top of the horizontal silicon pin diode comprising:
        a second positive region comprising p-type doped germanium substantially aligned with the first positive region;
        a second intrinsic region comprising germanium substantially aligned with the first intrinsic region; and,
        a second negative region comprising n-type doped germanium substantially aligned with the first negative region;
    an anode contact coupled to the first positive region for establishing electrical contact to both the first positive region and to the second positive region through the first positive region; and,
    a cathode contact coupled to the first negative region for establishing electrical contact to the first negative region and to the second negative region through the first negative region, thereby establishing a germanium on silicon photodetector with silicon contacts.

2. The photodetector of claim 1 comprising a total of two or more anode contacts.

3. The photodetector of claim 1 comprising a total of two or more cathode contacts.

4. The photodetector of claim 1, further comprising:
    an integrated waveguide disposed on the substrate and optically coupled to the germanium p-i-n.

5. The photodetector of claim 1 wherein the first intrinsic region comprises silicon selected from the list of:
    unintentionally doped silicon;
    lightly doped silicon;
    intrinsically doped silicon; and,
    un-doped silicon.

6. The photodetector of claim 1 wherein the second intrinsic region comprises germanium selected from the list of:
    unintentionally doped germanium;
    lightly doped germanium;
    intrinsically doped germanium; and,
    un-doped germanium.

7. The photodetector of claim 1, further comprising:
    an optical coupler for optically coupling an external waveguide to the germanium p-i-n.

8. The photodetector of claim 7, wherein the optical coupler comprises an evanescent coupler.

9. The photodetector of claim 7, wherein the optical coupler comprises an end-fire coupler.

10. The photodetector of claim 4 wherein:
    the integrated waveguide comprises silicon.

11. The photodetector of claim 4 wherein:
    the integrated waveguide comprises a silicon and germanium heterostructure.

12. The photodetector of claim 1 wherein:
    at least some portion of the germanium p-i-n comprises germanium selected from the list of a single layer of germanium, a multilayer germanium stack, a graded germanium layer, polycrystalline germanium, single crystal germanium and amorphous germanium.

13. The photodetector of claim 1 wherein:
    the silicon p-i-n is planar.

14. The photodetector of claim 1 wherein:
    at least some portion of the first intrinsic region comprising silicon is thicker than at least some portion of first positive region or the first negative region.

15. The photodetector of claim 1, wherein the substrate is selected from the list of:
    a silicon-on-insulator (SOI) substrate, a silicon-on-sapphire (SOS) substrate, a silicon substrate and a silicon substrate comprising at least one silicon germanium (SiGe) layer.

* * * * *